(12) United States Patent
Bogi et al.

(10) Patent No.: US 11,955,970 B2
(45) Date of Patent: Apr. 9, 2024

(54) INPUT-OUTPUT BUFFER TRACKING CIRCUITRY

(71) Applicant: Arm Limited, Cambridge (GB)

(72) Inventors: Seshagiri Rao Bogi, Bangalore (IN); Gurupadayya Shidaganti, Bangalore (IN); Akshaykumar V Jabi, Bangalore (IN); Vipul Patel Pursottam, Bangalore (IN)

(73) Assignee: Arm Limited, Cambridge (GB)

( * ) Notice: Subject to any disclaimer, the term of this patent is extended or adjusted under 35 U.S.C. 154(b) by 83 days.

(21) Appl. No.: 17/590,584

(22) Filed: Feb. 1, 2022

(65) Prior Publication Data

US 2023/0133850 A1 May 4, 2023

(30) Foreign Application Priority Data

Oct. 28, 2021 (IN) ............................ 202141049284

(51) Int. Cl.
*H03K 19/0185* (2006.01)
*H03K 19/003* (2006.01)

(52) U.S. Cl.
CPC ........... *H03K 19/018521* (2013.01); *H03K 19/00315* (2013.01)

(58) Field of Classification Search
CPC ............ H03K 19/01; H03K 19/017; H03K 19/01742; H03K 19/03; H03K 19/00315; H03K 19/0175; H03K 19/018521
See application file for complete search history.

(56) References Cited

U.S. PATENT DOCUMENTS

| | | | | |
|---|---|---|---|---|
| 7,986,171 B2 * | 7/2011 | Wang | ............... | H03K 19/0013 327/108 |
| 9,806,716 B2 * | 10/2017 | Dey | ............... | H03K 19/0013 |
| 10,644,701 B1 * | 5/2020 | Su | ............... | H03K 19/007 |
| 2008/0068050 A1 * | 3/2008 | Ajit | ............... | G11C 5/14 327/108 |
| 2010/0141324 A1 * | 6/2010 | Wang | ............... | H03K 19/018521 327/333 |
| 2016/0036441 A1 * | 2/2016 | Dey | ............... | H03K 19/018521 326/63 |
| 2016/0036445 A1 * | 2/2016 | Dey | ............... | H03K 19/018521 326/81 |
| 2016/0211847 A1 * | 7/2016 | Duby | ............... | H03K 3/356182 |
| 2017/0041002 A1 * | 2/2017 | Dey | ............... | H03K 19/018521 |
| 2019/0149149 A1 * | 5/2019 | Pan | ............... | H03K 17/687 327/109 |
| 2021/0208615 A1 * | 7/2021 | Bogi | ............... | G05F 1/575 |

(Continued)

*Primary Examiner* — Jason M Crawford
(74) *Attorney, Agent, or Firm* — Pramudji Law Group PLLC; Ari Pramudji

(57) ABSTRACT

Various implementations described herein are directed to a device having an input-output pad configured to receive and supply an input-output pad voltage. The device may include gate tracking circuitry that receives a first voltage, receives a second voltage different than the first voltage, receives node voltages and provides a first tracking voltage and a second tracking voltage based on the first voltage, the second voltage and the node voltages. The device may include output circuitry that receives the first tracking voltage and the second tracking voltage from the gate tracking circuitry and provides the input-output pad voltage to the input-output pad based on the first tracking voltage and the second tracking voltage.

23 Claims, 15 Drawing Sheets

(56) References Cited

U.S. PATENT DOCUMENTS

2022/0057824 A1\* 2/2022 Dey .......................... G05F 3/30
2023/0133850 A1\* 5/2023 Bogi ................ H03K 19/00315
　　　　　　　　　　　　　　　　326/81

\* cited by examiner

Generated Reference REFP = ( DVDD − REFN )

Generated Reference REFN = max ( DVDDLO, DVDD/2 )

Technology Limit (maximum allowable voltage) : 1.8V

400D

Mode Tracking Circuitry (rx_ctrl_track) 218,218D

600A

Nwell Track Circuitry 228

600B

Receiver (Rx) Input Tracking Circuitry 248

INPUT-OUTPUT BUFFER TRACKING CIRCUITRY

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some computing architecture, overdrive fail-safe/tolerant operations refer to electronic circuits that are designed to prevent unsafe operation of controlled components in event of failure of one or more internal circuit components. Therefore, fail-safe/tolerant circuits are designed to mitigate failure when failures occur. In reference to control logic, safe circuit operation may involve safely performing tasks, and in electrical engineering, fail-safes and tolerant behaviors are typically designed to implement features or practices that respond to and mitigate specific types of failures that can cause excessive to minimal to no-harm for some internal circuit components.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to IO buffer pad tracking schemes and techniques. For instance, the various schemes and techniques described herein may provide for fail-safe/tolerant input-output (IO) pad circuitry. In some scenarios, for some operating conditions, various related circuitry may operate with a supply voltage (DVDD) of approximately 3.3V, and in other instances, under fail-safe operating conditions, various circuitry may operate with a supply voltage (DVDD) of 0V and with an intermediate voltage supply (DVDDLO) of 0V. In this instance, the IO circuitry should be in Hi-Z state when power (DVDD, DVDDLO)=0, and/or when the pad is driven externally with various supply voltage levels, such as 3.3V or 2.5V or 1.8V, and in other instances, under tolerant operating conditions, various circuitry may operate with a supply voltage (DVDD) of 1.8V or 2.5V and with an intermediate voltage supply (DVDDLO) of 1.8V, and the pad may be driven externally with various supply voltage levels, such as 3.3V/2.5V or 3.3V. In this instance, the IO output circuitry should be in Hi-Z state.

Thus, various implementations described herein provide for gate/well IO buffer pad tracking under normal operation and also under fail-safe/tolerant operation. Various implementations described herein may provide for various tracking circuitry that uses low voltage devices, such as 1.8V devices, for some circuitry that operate with power sequence independent fail-safe/tolerant support in different voltage level domains (e.g., 3.3V/2.5V/1.8V). Advantages of using the IO buffer pad tracking schemes and techniques described herein may provide for overdrive (e.g., 3.3V/2.5V/1.8V) fail-safe and/or tolerant support when using 1.8V devices, multi-voltage domain fail-safe/tolerant support and/or high-speed fail-safe/tolerant support for various applications that involve power sequence independence and related operational conditions.

Various implementations of IO buffer pad tracking schemes and techniques will be described in detail herein with reference to FIGS. 1-7.

Figure 1:
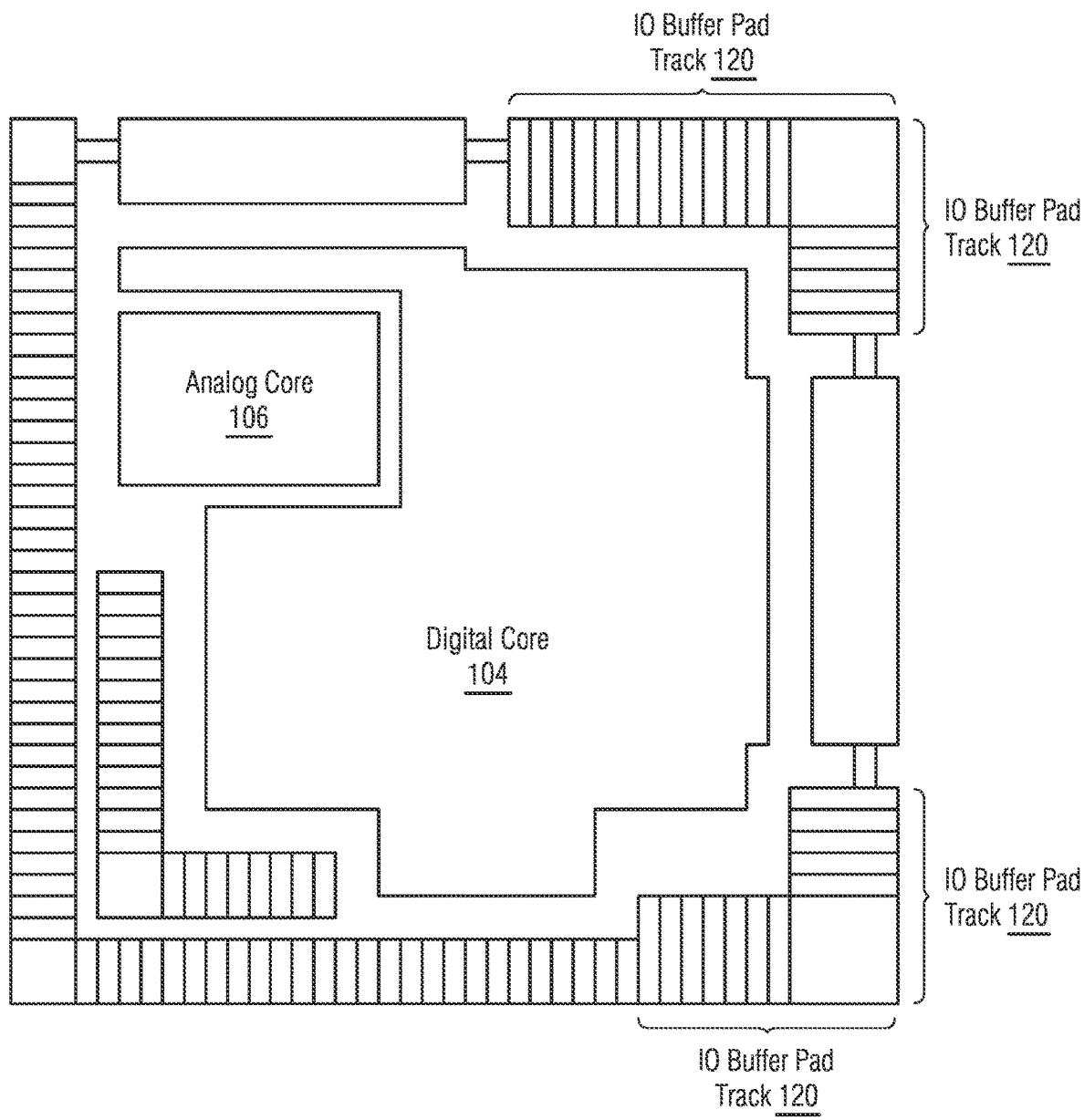
FIG. 1 illustrates a diagram of chip-level circuitry in accordance with various implementations described herein.

FIG. 1 illustrates a diagram 100 of chip-level circuitry 102 in accordance with various implementations described herein.

In various implementations, the chip-level circuitry 102 may be implemented as a system or a device having various integrated circuit (IC) components that are arranged and coupled together as an assemblage or combination of parts that provide for a physical circuit design and related structures. In some instances, a method of designing, providing and building the chip-level circuitry 102 as an integrated system or device that may involve use of various IC circuit components described herein so as to thereby implement IO buffer pad tracking schemes and techniques associated therewith. The chip-level circuitry 102 may be integrated with computing circuitry and related components on a single chip, and the chip-level circuitry 102 may be implemented in various embedded systems for electronic, mobile and Internet-of-things (IoT) applications, including sensor nodes.

As shown in FIG. 1, the chip-level circuitry 102 may refer to a system-on-a-chip (SoC) that may include a digital core 104, an analog core 106, and input-output (IO) buffer pad tracking circuitry 120. In some implementations, the SoC refers to integrated circuitry (IC) that integrates various logic components on a single chip or substrate. Since some SoCs operate with low power and with less area than other multi-chip designs with equivalent functionality, SoCs may be advantageously implemented in mobile computing type devices, edge computing devices, embedded devices and/or Internet-of-Things (IoT) type devices. Also, in some implementations, the IO buffer pad tracking circuitry 120 may be utilized for communication between various internal components (e.g., 104, 106) and external components. The IO buffer pad tracking circuitry 120 may have one or more IO ports that receive input signals and/or provide output signals, and as such, the IO buffer pad tracking circuitry 120 may perform various IO operations. As further described herein, the IO buffer pad tracking circuitry 120 may be configured with fail-safe/tolerant circuitry for implementing fail-safe/tolerant mode operational characteristics and behaviors.

Figure 2A:
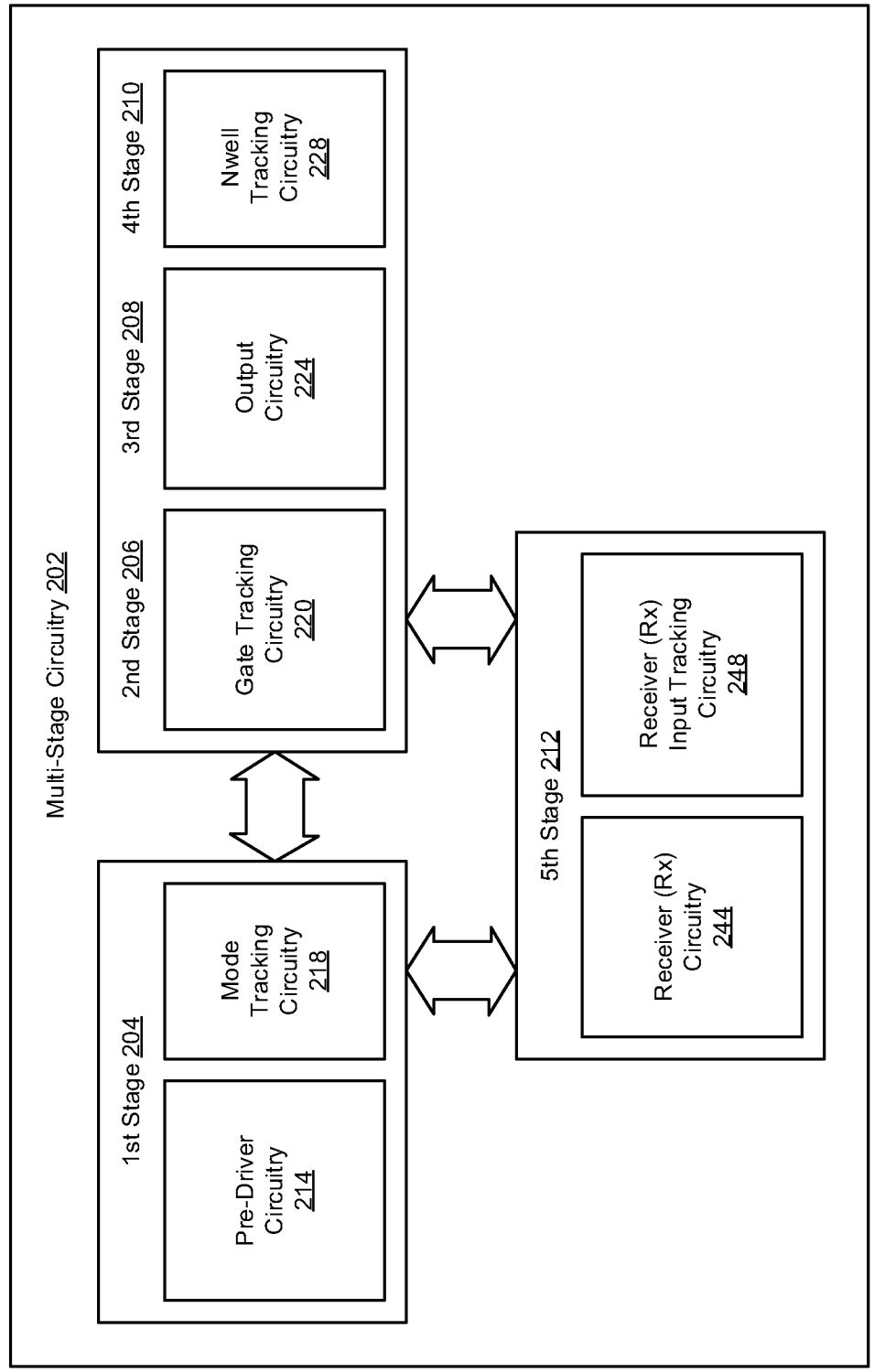
FIGS. 2A-2D illustrate diagrams of input-output buffer pad tracking circuitry in accordance with various implementations described herein.
Figure 2B:
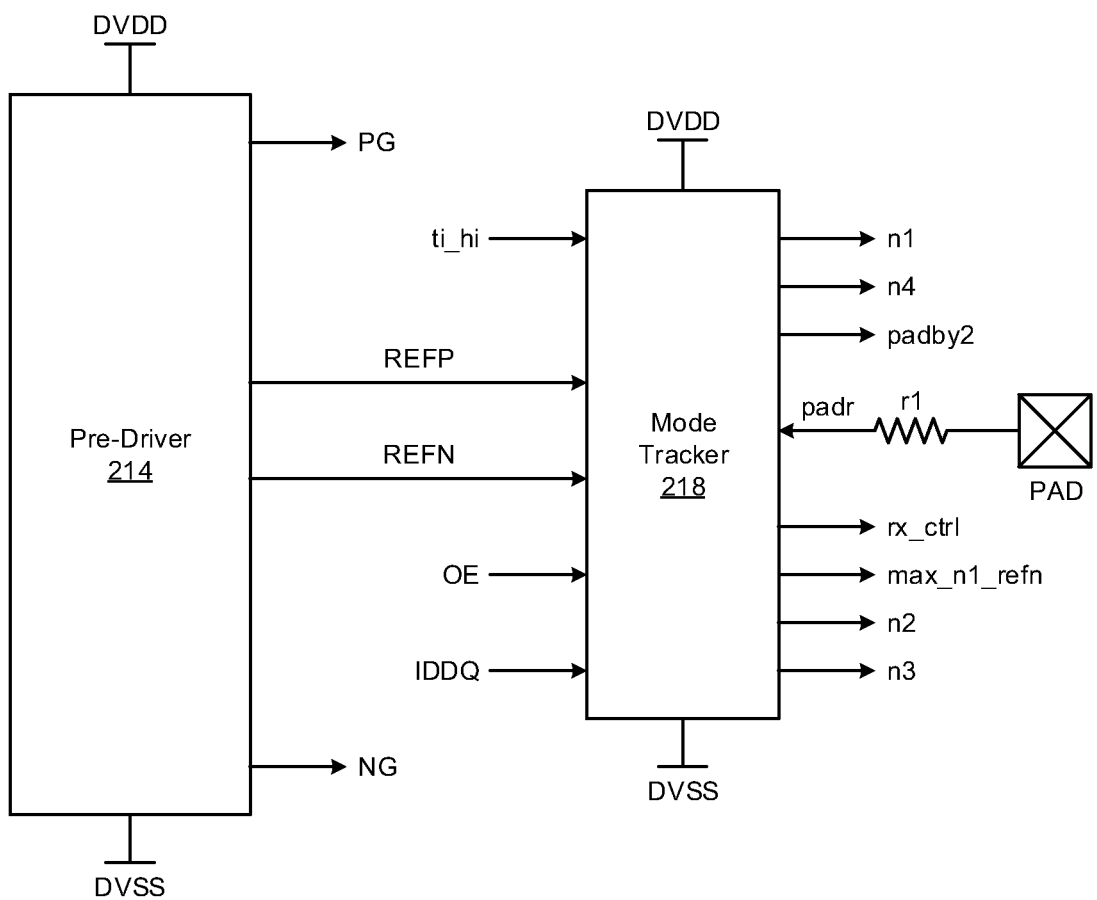
Figure 2C:
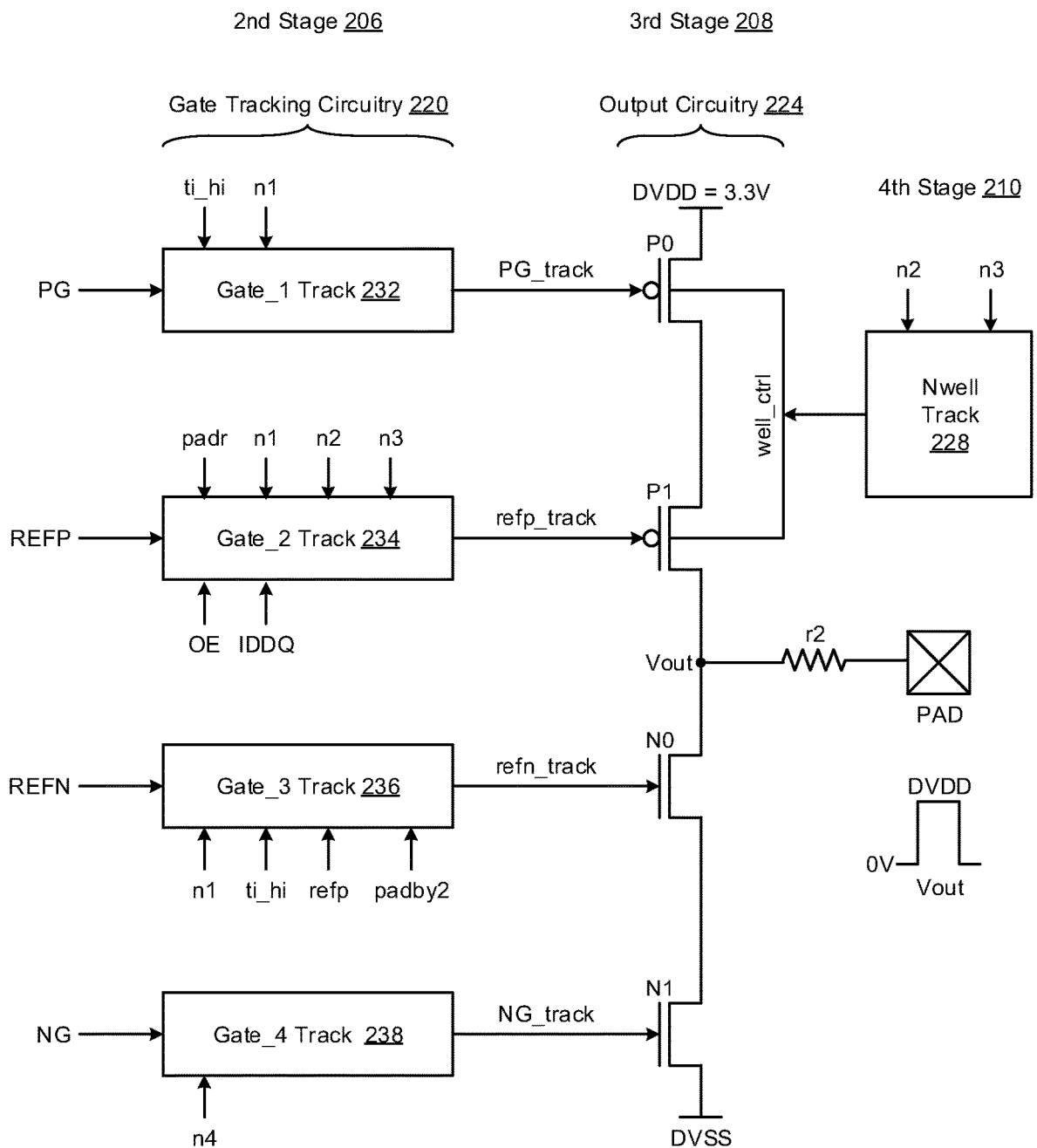
Figure 2D:
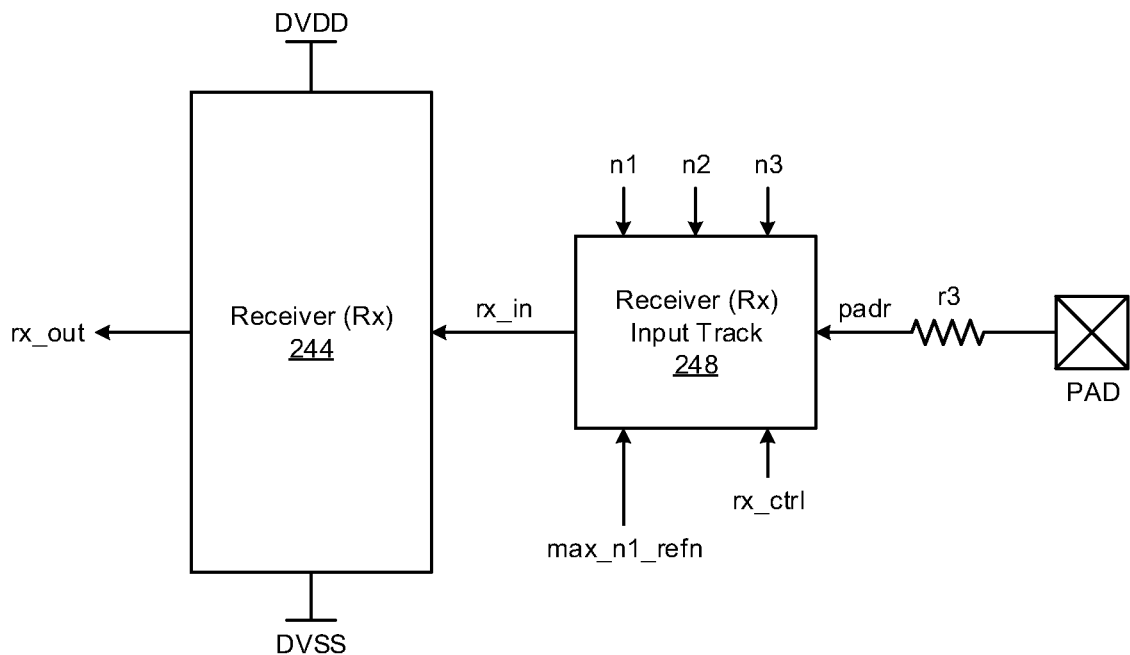

FIGS. 2A-2D illustrate various schematic diagrams of input-output (IO) buffer pad tracking circuitry 120 in reference to implementations described herein. In particular, FIG. 2A shows a diagram 200A of IO buffer pad tracking circuitry 120A with multi-stage circuitry 202, FIG. 2B shows a diagram 200B of IO buffer pad tracking circuitry 120B with a first stage 204 of the multi-stage circuitry 202, FIG. 2C shows a diagram 200C of IO buffer pad tracking circuitry 120C with a second stage 206 and a third stage 208 of the multi-stage circuitry 202, and FIG. 2D shows a diagram 200D of IO buffer pad tracking circuitry 120D with a fifth stage 212 of the multi-stage circuitry 202.

In various implementations, the IO buffer pad tracking circuitry 120 in FIGS. 2A-2D may be implemented as a system or a device having various integrated circuit (IC) components that are arranged and coupled together as an assemblage or combination of parts that provide for a physical circuit design and related structures. In some instances, a method of designing, providing and building the IO buffer pad tracking circuitry 120 as an integrated system or device that may involve the use of various IC circuit components described herein so as to thereby implement various IO buffer pad tracking schemes and techniques associated therewith. In various instances, the IO buffer pad tracking circuitry 120 may be integrated with computing circuitry and components on a single chip, and the IO buffer pad tracking circuitry 120 may be implemented in various embedded systems for electronic, mobile and IoT applications, including remote sensor nodes.

As shown in FIG. 2A, the IO buffer pad tracking circuitry 120A may refer to multi-stage circuitry 202 having multiple stages including a first stage 204, a second stage 206, a third stage 206, a fourth stage 210, and a fifth stage 212. The first stage 204 may have pre-driver circuitry 214 and mode tracking circuitry 218, and the second stage 206 may have gate tracking circuitry 220. The third stage 206 may have output circuitry 224, and the fourth stage 210 may have Nwell tracking circuitry 228. Also, the fifth stage 212 may have receiver (Rx) circuitry 244 and receiver (Rx) input tracking circuitry 248.

In some implementations, the third stage 208 refers to an output stage having the output circuitry 224 with output transistors that receive tracking signals and provide an input-output pad voltage to an input-output (IO) pad based on the tracking signals. Also, the second stage may refer to a gate tracking stage having the gate tracking circuitry 220 that receives operational voltages, receives node voltages and provides the tracking signals to the output transistors based on the operational voltages and the node voltages. Also, the first stage may refer to a mode tracking stage having the mode tracking circuitry 218 that also receives the operational voltages, receives the input-output pad voltage as a feedback voltage, and then provides the node voltages to the gate tracking circuitry 220 based on the operational voltages and the feedback voltage.

In various implementations, the tracking signals may refer to various voltage signals including a first tracking signal, a first reference tracking signal, a second tracking signal, and a second reference tracking signal. Also, the operational voltages may include various voltage signals including a first voltage, a first reference voltage related to the first voltage, a second voltage different than the first voltage, and a second reference voltage related to the second voltage. Moreover, in various instances, the mode tracking circuitry 218 may receive the first reference voltage, receive the second reference voltage, receive the input-output pad voltage as the feedback voltage, and then provide the node voltages to the gate tracking circuitry 220 based on the first reference voltage, the second reference voltage and the feedback voltage.

In various implementations, the fourth stage 210 may refer to an N-well tracking stage having Nwell tracking circuitry 228 that receives one or more of the node voltages and provides a well control signal to base terminals of one or more of the output transistors of the output circuitry 224. Moreover, the fifth stage 212 may refer to a receiver (Rx) stage having the Rx circuitry 244 and the Rx input tracking circuitry 248. The Rx input tracking circuitry 248 may receive the node voltages, receive the feedback voltage and provide a receiver (Rx) input signal, and also, the Rx circuitry 244 may receive the Rx input signal and provide a receiver (Rx) output signal based on the Rx input signal.

As shown in FIG. 2B, the IO buffer pad tracking circuitry 120B may have the first stage 204 of the multi-stage circuitry 202 in FIG. 2A. The first stage 204 may include the pre-driver circuitry 214 that is coupled between supply voltages (DVDD, DVSS). Also, in various instances, the pre-driver circuitry 214 is configured to provide multiple different voltage signals including the first voltage (PG), the second voltage (NG), the first reference signal (REFP) associated with the first voltage (PG), and also, the second reference signal (REFN) associated with the second voltage (NG).

The first stage 204 may include the mode tracking circuitry 218 that is coupled between supply voltages (DVDD, DVSS). In various instances, the mode tracking circuitry 218 may be configured to receive multiple different voltage signals including, e.g., the first reference signal (REFP), the second reference signal (REFN), a tie-high signal (ti_hi), and one or more control signals (e.g., OE, IDDQ). Also, the mode tracking circuitry 218 may be configured to receive an input-output pad voltage (padr) from an input-output pad (PAD) by way of a resistor (r1). Also, the mode tracking circuitry 218 may be configured to provide multiple different node voltages (e.g., n1, n2, n3, n4) as output along with various different control signals (e.g., padby2, rx_ctrl, max_n1_refn) as other output based on the various different input signals (e.g., REFP, REFN, ti_hi, OE, IDDQ).

As shown in FIG. 2C, the IO buffer pad tracking circuitry 120C may have the second stage 206 and the third stage 208 of the multi-stage circuitry 202 in FIG. 2A. In various instances, the second stage 206 may include the gate tracking circuitry 220 with multiple gate tracking circuits (232, 234, 236, 238) that are configured to receive multiple different voltage signals (e.g., PG, NG, REFP, REFN) and then provide multiple different voltage tracking signals (e.g., PG_track, NG_track, refp_track, refn_track). Also, in some instances, the gate tracking circuitry 220 may receive the input-output pad voltage (padr), the multiple different node voltages (e.g., n1, n2, n3, n4), the various different control signals (e.g., padby2, rx_ctrl, max_n1_refn), and also, the various different input signals (e.g., ti_hi, OE, IDDQ).

In some implementations, the gate tracking circuitry 220 may include a first gate tracking circuit (Gate_1 Track) 232 that is configured to receive various different voltage signals (e.g., PG, ti_hi, n1) as input and then provide the PG_track signal as output to the output circuitry 224. In addition, the gate tracking circuitry 220 may include a second gate tracking circuit (Gate_2 Track) 234 that is configured to receive various different voltage signals (e.g., REFP, padr, n1, n2, n3, OE, IDDQ) as input and then provide the refp_track signal as output to the output circuitry 224.

In some implementations, the gate tracking circuitry 220 may include a third gate tracking circuit (Gate_3 Track) 236 that is configured to receive various different voltage signals (e.g., REFN, n1, ti_hi, refp, padby2) as input and then provide the refn_track signal as output to the output circuitry 224. In addition, the gate tracking circuitry 220 may include a fourth gate tracking circuit (Gate_4 Track) 238 that is configured to receive various different voltage signals (e.g., NG, n4) as input and then provide the NG_track signal as output to the output circuitry 224.

In various implementations, the third stage 208 may include the output circuitry 224 having multiple output transistors (e.g., P0, P1, N0, N1) that are configured to receive the multiple different voltage tracking signals (PG_track, NG_track, refp_track, refn_track) and then provide the input-output pad voltage signal (e.g., Vout) to the input-output pad (PAD) by way of a resistor (r2). Also, the output circuitry 224 may receive a well control signal (e.g., well_ctrl) from the Nwell tracking circuitry 228 in the fourth stage 210.

In some implementations, the output transistors of the output circuitry 224 may have a first output transistor (P0), a second output transistor (P1), a third output transistor (N0), and also a fourth output transistor (N1) that are coupled is series between the supply voltages (DVDD, DVSS). In some instances, as shown in FIG. 2C, the first gate tracking circuit (Gate_1 Track) 232 may provide the PG_track signal to the gate of the first output transistor (P0), and also, the second gate tracking circuit (Gate_2 Track) 234 may provide the refp_track signal to the gate of the second output transistor (P1). In addition, the third gate tracking circuit (Gate_3 Track) 236 may provide the refn_track signal to the gate of the third output transistor (N0), and also, the fourth gate tracking circuit (Gate_4 Track) 238 may provide the NG_track signal to the gate of the fourth output transistor (N1).

In various implementations, the output circuitry 224 may include an output node (Vout) that is disposed between the second and third transistors (P1, N0), wherein in this instance, the input-output pad voltage signal (e.g., Vout) is provided by the output node (Vout) to the input-output pad (PAD) by way of the resistor (r2). In various instances, the output voltage (Vout) may refer to a pulse in a voltage range between 0V and DVDD, which may refer to 3.3V (i.e., DVDD=3.3V). Also, in some implementations, the fourth stage 210 may include the Nwell tracking circuitry 228 that receives one or more of the node voltages (e.g., n2, n3) and then provides the well control signal (well_ctrl) to base terminals of the first and second transistors (P0, P1). Moreover, in various instances, the first and second transistors (P0, P1) may include P-type transistors (e.g., PMOS), and also, the third and fourth transistors (N0, N1) may include N-type transistors (e.g., NMOS); however, various other transistor configurations may be used to achieve similar results.

As shown in FIG. 2D, the IO buffer pad tracking circuitry 120D may have the fifth stage 212 of the multi-stage circuitry 202 in FIG. 2A. In various instances, the fifth stage 212 may include the receiver (Rx) circuitry 244 and the receiver (Rx) input tracking circuitry 248. In some instances, the Rx circuitry 244 may be coupled between the supply voltages (DVDD, DVSS), and also, the Rx circuitry 244 may receive a receiver (Rx) input signal (rx_in) from the Rx input tracking circuitry 248 and provide a receiver (Rx) output signal (rx_out) to an external or internal system, device or circuit, such as, e.g., a digital core. Also, the Rx input tracking circuit 248 may receive multiple different voltage signals (e.g., n1, n2, n3, padr, rx_ctrl, max_n1_refn) and then provide the rx_out signal to the Rx circuitry 244. Also, in some instances, the Rx input tracking circuit 248 may receive the input-output pad voltage (padr) from the input-output pad (PAD) by way of a resistor (r3).

Figure 3A:
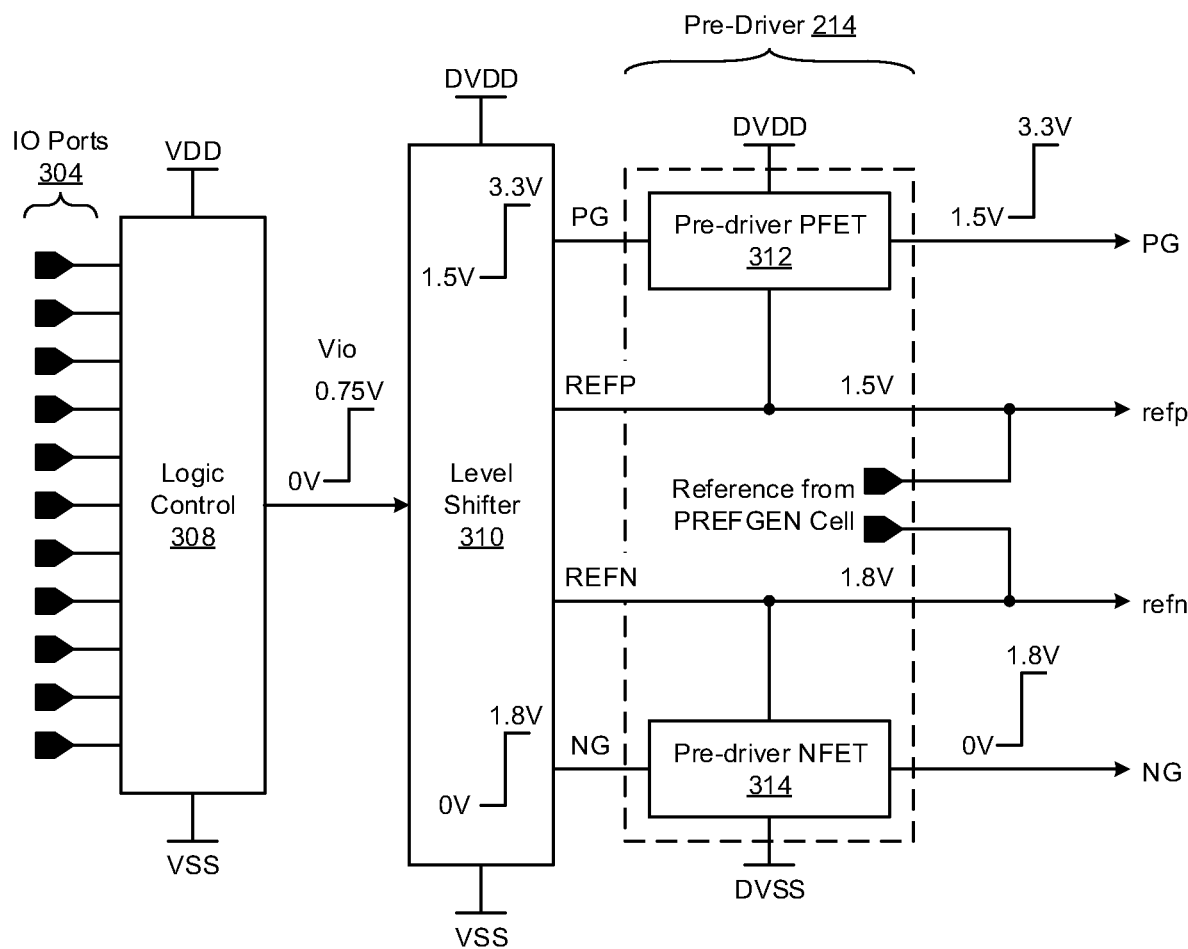
FIGS. 3A-3B illustrate other diagrams of input-output (IO) buffer pad tracking circuitry in accordance with various implementations described herein.
Figure 3B:
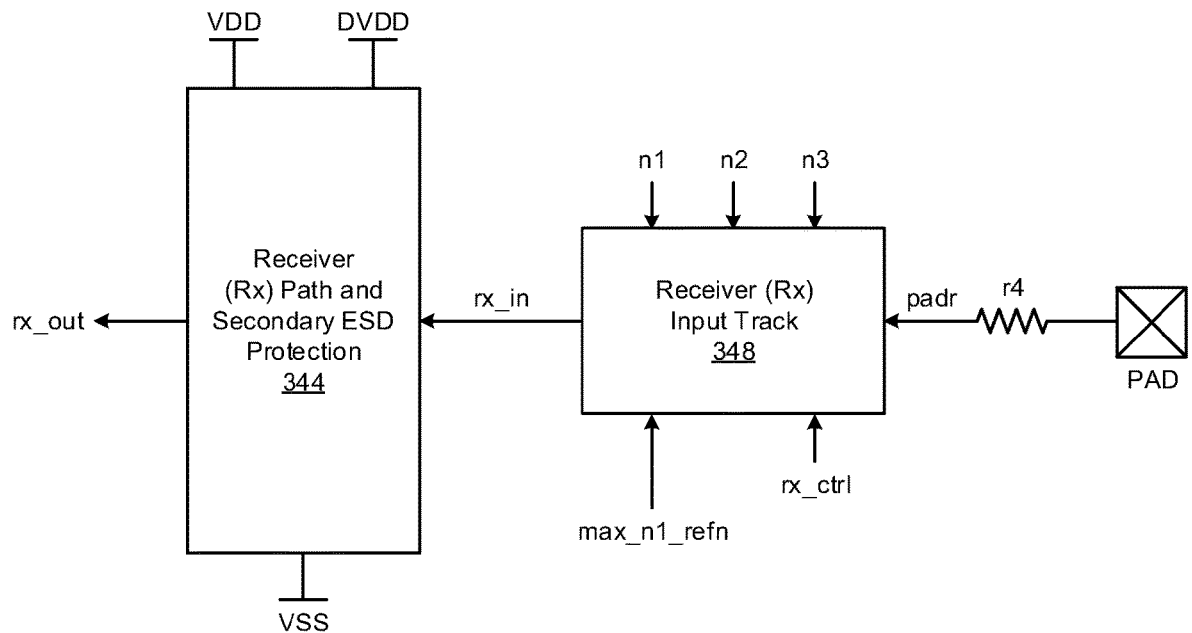

FIGS. 3A-3B illustrate other diagrams of input-output (IO) buffer pad tracking circuitry 320 in accordance with various implementations described herein. In particular, FIG. 3A shows a diagram 300A of IO buffer pad tracking circuitry 320A, and FIG. 3B shows a diagram 300B of IO buffer pad tracking circuitry 320B.

As shown in FIG. 3A, the IO buffer pad tracking circuitry 320A may include various circuits and/or components including logic control circuitry 308 and level shifting circuitry 310. In some instances, the logic control circuitry 308 may include one or more IO ports 304 that are configured to receive one or more IO signals from internal sources and/or external sources. In various instances, the internal sources may refer to on-chip circuitry associated with the chip-level circuitry 102 as shown in FIG. 1, such as, e.g., the digital core 104 and/or the analog core 106, and also, the external sources may refer to off-chip devices that are external to the chip-level circuitry 102 in FIG. 1. In various instances, the logic control circuitry 308 may be coupled to a first voltage domain, such as, e.g., a core voltage domain that may be configured to provide a core supply voltage (VDD) and a core ground supply voltage (VSS). Also, in various instances, one or more components of the IO buffer pad tracking circuitry 320A, such as, e.g., the level shifting circuitry 310, may be coupled to a second voltage domain, such as, e.g., an IO voltage domain that is different than the first voltage domain and that may be configured to provide an IO supply voltage (DVDD) and an IO ground supply voltage (DVSS).

In some implementations, the logic control circuitry 308 is coupled between the core supply voltages (VDD, VSS), and the level shifter circuitry 310 is coupled between the IO supply voltages (DVDD, DVSS). Also, the pre-driver circuitry 214 may be coupled between the IO supply voltages (DVDD, DVSS). The logic control circuitry 308 may be configured to receive one or more IO signals by way of the one or more IO ports 304 and then provide an IO voltage (Vio) to the level shifting circuitry 310. Also, in some instances, the level shifting circuitry 310 may operate as a level shifter that is configured to receive the IO voltage (Vio) from the logic control circuitry 308, provide the first voltage (PG) based on the IO voltage (Vio), and provide the second voltage (NG) based on the IO voltage (Vio) that is different than the first voltage (PG). In some instances, the IO voltage (Vio) may refer to an overdrive input-output (IO) voltage, and the level shifting circuitry 210 may receive the overdrive IO voltage (Vio), provide the first voltage (PG) based on the overdrive IO voltage (Vio), and provide the second voltage (NG) based on the overdrive IO voltage (Vio). Also, the logic control circuitry 308 may be configured to provide the IO voltage (Vio) within a voltage range of 0V to 0.75V, and the level shifting circuitry 310 may include level shifters that are configured to receive the IO voltage (Vio) and provide the first voltage (PG), the second voltage (NG), the first reference voltage (REFP), and also, the second reference voltage (REFN).

In a first mode of operation, the first voltage (PG) may be within a voltage range of 1.5V and 3.3V, the second voltage (NG) may be within a voltage range of 0V and 1.8V, the first reference voltage (REFP) may be 1.5V, and the second reference voltage (REFN) may be 1.8V. In a second mode of operation, the first voltage (PG) may operate within a voltage range of 0.7V and 2.5V, the second voltage (NG) may remain within a voltage range of 0V and 1.8V, the first reference voltage (REFP) may be 0.7V, and the second reference voltage (REFN) may remain at 1.8V. Also, in a third mode of operation, the first voltage (PG) may be within a voltage range of 0V and 1.8V, the second voltage (NG) may remain within a voltage range of 0V and 1.8V, the first reference voltage (REFP) may be 0V, and the second reference voltage (REFN) may remain at 1.8V.

In some implementations, the pre-driver circuitry 214 may have various devices and/or circuits, such as, e.g., a first device 312, such as, e.g., a pre-driver PFET, that may be configured to receive the first voltage (PG), receive the first reference voltage (REFP), and then provide the first voltage (PG) to the gate tracking circuitry 220 based on the PG and REFP signals. Also, the pre-driver circuitry 214 may have a second device 314, such as, e.g., a pre-driver NFET, that may be configured to receive the second voltage (NG), receive the second reference voltage (REFN), and then provide the second voltage (NG) to the gate tracking circuitry 220 based on the NG and REFN signals. In some instances, a reference voltage from a PREFGEN cell may be provided to the first reference voltage (REFP) line and to the second reference voltage (REFN) line.

In various implementations, the first voltage (PG) may refer to a first operating voltage in a first range, and also, the second voltage (NG) may refer to a second operating voltage in a second range that is different than the first range. In some instances, the first range may refer to a voltage range between a first intermediate voltage (e.g., 1.5V) and an upper boundary voltage (e.g., 3.3V), and also, the second range may refer to a voltage range between a lower boundary voltage (e.g., 0V) and a second intermediate voltage (1.8V). In various instances, the level shifting circuitry 210 may be configured to provide the first reference voltage (refp) and the second reference voltage (refn) that is different than the first reference voltage (refp). In some instances, the first reference voltage (refp) may refer to a voltage level that may be similar to the first intermediate voltage (e.g., 1.5V), and also, the second reference voltage (refn) may refer to another voltage level that may be similar to the second intermediate voltage (e.g., 1.8V).

In various instances, the first supply voltage (DVDD) may vary under different operating conditions; e.g., in different modes of operation, wherein the first supply voltage (DVDD) may refer to the first level (e.g., 3.3V), the second level (e.g., 2.5V), or the third level (e.g., 1.8V). Thus, the first supply voltage may operate between an upper boundary voltage (3.3V, 2.5V, 1.8V) and a corresponding first intermediate voltage (1.5V, 0.7V, 0V), and also, the second supply voltage my operate between the lower boundary voltage (0V) and the second intermediate voltage (1.8V). In this instance, the first reference voltage (refp) may be generated from the first supply voltage (DVDD) minus the second reference voltage (refn) such that: REFP=DVDD−REFN. In some instances, the second reference voltage (refn) may be generated from a maximum value of the first supply voltage (DVDD), such that: REFN=max (DVDDLO, DVDD/2), wherein DVDDLO may vary across PVT from ~1.62V to ~1.98V. Thus, REFN max voltage may be ~1.98V. Moreover, in various instances, fail-safe operation may refer to voltage levels associated with DVDD=0V and DVDDLO=0V, and also, tolerant operation may refer to voltage levels associated with DVDD=1.8V/2.5V along with PAD=2.5V/3.3V, respectively.

As shown in FIG. 3B, the IO buffer pad tracking circuitry 320B may include various circuits and/or components including receiver (Rx) path circuitry 308 and receiver (Rx) input tracking circuitry 348 along with the pre-driver circuitry 214. In some instances, the Rx path circuitry 308 may include secondary electro-static discharge (ESD) protection circuitry. In various instances, the Rx path circuitry 308 may be coupled between the core and IO supply voltages (VDD, DVDD, VSS), and also, the Rx path circuitry 308 may receive the rx_in signal form the Rx input tracking circuitry 348 and provide the rx_out signal to an external or internal circuitry, such as, e.g., a digital core. The Rx input tracking circuit 348 may receive multiple different voltage signals (e.g., n1, n2, n3, padr, rx_ctrl, max_n1_refn) and then provide the rx_out signal to the Rx path circuitry 344. In addition, in some instances, the Rx input tracking circuit 348 may receive the input-output pad voltage (padr) from the input-output pad (PAD) by way of a resistor (r4).

In various implementations, in reference to FIGS. 2A-2D and FIGS. 3A-3B, IO buffer pad tracking circuitry 220, 320 (or some combination thereof) may be configured as a device that is used for implementing the various IO buffer pad tracking schemes and techniques described herein. For instance, the IO buffer pad tracking circuitry 220, 320 may include the input-output pad (PAD) that is configured to receive the input-output pad voltage (e.g., padr) and supply the input-output pad voltage (e.g., Vout). Also, the IO buffer pad tracking circuitry 220, 320 may have gate tracking circuitry 220 that receives the first voltage (PG), receives the second voltage (NG) that is different than first voltage (PG), receives node voltages (n1, n2, n3, n4) and provides the first tracking voltage (PG_track) and the second tracking voltage (NG_track) based on the first voltage (PG), the second voltage (NG), and the node voltages (n1, n2, n3, n4). Also, in some instances, the IO buffer pad tracking circuitry 220, 320 may have output circuitry 224 that receives the first tracking voltage (PG_track) and the second tracking voltage (NG_track) from the gate tracking circuitry 220 and provides the input-output pad voltage (e.g., Vout) to the input-output pad (PAD) based on the first tracking voltage (PG_track) and the second tracking voltage (NG_track).

In various implementations, the IO buffer pad tracking circuitry 220, 320 may include mode tracking circuitry 218 that is configured to receive the first reference voltage (REFP), receive the second reference voltage (REFN) that is different than first reference voltage (REFP), receive the input-output pad voltage (e.g., Vout) as a feedback voltage, and provide the node voltages (n1, n2, n3, n4) based on the first reference voltage (REFP), the second reference voltage (REFN) and the feedback voltage (e.g., Vout). Also, the IO buffer pad tracking circuitry 220, 320 may include the receiver (Rx) input tracking circuitry 248, 348 that receives the node voltages (n1, n2, n3, n4), receives the input-output pad voltage (e.g., padr), and provides the receiver input signal (rx_in). Also, the IO buffer pad tracking circuitry 220, 320 may further include the receiver (Rx) circuitry 244, 344 that receives the Rx input signal (rx_in) and then provides a receiver (Rx) output signal (rx_out) based on the Rx input signal (rx_in).

In various implementations, the first voltage (PG) may refer to a first operating voltage in a first range, the second voltage (NG) may refer to a second operating voltage in a second range different than the first range, the first reference voltage (REFP) may be associated with the first operating voltage (PG), and also, the second reference voltage (REFN) may be associated with the second operating voltage (NG). In some instances, the gate tracking circuitry 220 may receive the first reference voltage (REFP), receive the second reference voltage (REFN) that is different than the first reference voltage (REFP), receive the feedback voltage (e.g., Vout) and provide the first reference tracking voltage (refp_track) and also the second reference tracking voltage (refn_track) based on the first reference voltage (REFP), the second reference voltage (REFN), the feedback voltage (e.g., Vout), and the node voltages (n1, n2, n3, n4).

In some implementations, the output circuitry 224 may have multiple transistors (P0, P1, N0, N1) that are coupled between the gate tracking circuitry 220 and the input-output pad (PAD), and also, the multiple transistors (P0, P1, N0, N1) may include the first transistor (P0), the second transistor (P1), the third transistor (N0) and the fourth transistor (N1). Also, the IO buffer pad tracking circuitry 220, 320 may have N-well tracking circuitry 228 that receives one or more of the node voltages (n1, n2, n3, n4) and then provides the well control signal (well_ctrl) to base terminals of the first transistor (P0) and the second transistor (P1) of the output circuitry 224.

In some implementations, the gate tracking circuitry 220 may have the first gate tracking circuitry (Gate_1 Track) 232 along with the second gate tracking circuitry (Gate_2 Track) 234. The first gate tracking circuitry (Gate_1 Track) 232 receives the first voltage (PG), receives one or more of the nodes voltages (n1, n2, n3, n4), and provides the first tracking voltage (PG_track) to a gate of first transistor (P0). Also, the second gate tracking circuitry (Gate_2 Track) 234 receives the first reference voltage (REFP), receives one or more of the nodes voltages (n1, n2, n3, n4), and then provides the first reference tracking voltage (refp_track) to a gate of second transistor (P1).

In some implementations, the gate tracking circuitry 220 may include the third gate tracking circuitry (Gate_3 Track) 236 and fourth gate tracking circuitry (Gate_4 Track) 238. The third gate tracking circuitry (Gate_3 Track) 236 receives the second reference voltage (REFN), receives one or more of the nodes voltages (n1, n2, n3, n4), and provides the second reference tracking voltage (refn_track) to a gate of third transistor (N0). Also, the fourth gate tracking circuitry (Gate_4 Track) 238 receives the second voltage (NG), receives one or more of the nodes voltages (n1, n2, n3, n4) and then provides the second tracking voltage (NG_track) to a gate of fourth transistor (N1).

In some implementations, the first transistor (P0) may be coupled between the first supply voltage (DVDD) and the second transistor (P1), and also, the second transistor (P1) may be coupled between the first transistor (P0) and the third transistor (N0). Also, in some instances, the third transistor (N0) may be coupled between the second transistor (P1) and the fourth transistor (N1), and further, the fourth transistor (N1) may be coupled between the third transistor (N0) and the second supply voltage (DVSS) that is different than the first supply voltage (DVDD).

In some implementations, the input-output pad (PAD) may be coupled to a node (Vout) disposed between the second transistor (P1) and the third transistor (N0). The first supply voltage (DVDD) may be provided to the input-output pad (PAD) as the input-output pad voltage (Vout) when the first transistor (P0) and the second transistor (P1) are activated and also when at least one of the third transistor (N0) and the fourth transistor (N1) are deactivated. Also, the second supply voltage (DVSS) may be provided to the input-output pad (PAD) as the input-output pad voltage (Vout) when at least one of the first transistor (P0) and the second transistor (P1) are deactivated and also when the third transistor (N0) and the fourth transistor (N1) are activated. In some instances, the input-output pad (PAD) may be charged to the first supply voltage (DVDD) when the first transistor (P0) and the second transistor (P1) are activated and when at least one of the third transistor (N0) and the fourth transistor (N1) are deactivated. Also, in some instances, the input-output pad (PAD) may be discharged to the second supply voltage (DVSS) when at least one of the first transistor (P0) and the second transistor (P1) are deactivated and when the third transistor (N0) and the fourth transistor (N1) are activated.

In various implementations, the first supply voltage (DVDD) may be between a first intermediate voltage (e.g., 1.5V, 0.7V, 0V) and an upper boundary voltage (e.g., 3.3V, 2.5V, 1.8V), and the second supply voltage (DVSS) may be between a lower boundary voltage (e.g., 0V) and a second intermediate voltage (e.g., 1.8V). Also, in some instances, during a fail-safe condition, the first supply voltage (DVDD) may be similar to the lower boundary voltage (e.g., 0V), and also, the input-output pad voltage may be similar to the upper boundary voltage (e.g., 3.3V).

In various implementations, during a tolerant condition, the first supply voltage (DVDD) may be similar to the upper boundary voltage at the third level (e.g., 1.8V) that is less than the second level (e.g., 2.5V), and also, the second reference voltage (REFN) may be similar to the second intermediate voltage (e.g., 1.8V), and further, the second supply voltage (DVSS) may be similar to the lower boundary voltage (e.g., 0V). Also, in some instances, the first reference voltage (REFP) may be similar to the upper boundary voltage at the third level (e.g., 1.8V) minus the second intermediate voltage (e.g., 1.8V), which refers to the lower boundary voltage (e.g., 0V), and also, the input-output pad voltage (PAD) may be similar to the upper boundary voltage at a first level (e.g., 3.3V).

In various implementations, during a tolerant condition, the first supply voltage (DVDD) may be similar to the upper boundary voltage at the third level (e.g., 1.8V) that is less than the second level (e.g., 2.5V), the second reference voltage (REFN) may be similar to the second intermediate voltage (e.g., 1.8V), and the second supply voltage (DVSS) may be similar to the lower boundary voltage (e.g., 0V). Also, in some instances, the first reference voltage (REFP) may be similar to the upper boundary voltage at the third level (e.g., 1.8V) minus the second intermediate voltage (e.g., 1.8V), which refers to the lower boundary voltage (e.g., 0V), and also, the input-output pad voltage (PAD) may be similar to the upper boundary voltage at the second level (e.g., 2.5V).

In various implementations, during a tolerant condition, the first supply voltage (DVDD) may be similar to the upper boundary voltage at the second level (e.g., 2.5V) that is less than the first level (e.g., 3.3V), the second reference voltage (REFN) may be similar to the second intermediate voltage (e.g., 1.8V), and the second supply voltage (DVSS) may be similar to the lower boundary voltage (e.g., 0V). Also, the first reference voltage (REFP) may be similar to the upper boundary voltage at the second level (e.g., 2.5V) minus the second intermediate voltage (e.g., 1.8V), which refers to the lower boundary voltage (e.g., 0.7V), and also, the input-output pad voltage (PAD) may be similar to the upper boundary voltage at a first level (e.g., 3.3V).

In various implementations, during a first mode of operation, the first supply voltage (DVDD) may be similar to the upper boundary voltage at the first level (3.3V), the second reference voltage (REFN) may be similar to the second intermediate voltage (e.g., 1.8V), and also, the second supply voltage (DVSS) may be similar to the lower boundary voltage (e.g., 0V). Further, the first reference voltage (REFP) may be similar to the upper boundary voltage at the first level (e.g., 3.3V) minus the second intermediate voltage (e.g., 1.8V), which refers to the first intermediate voltage (e.g., 1.5V)

In various implementations, during a second mode of operation, the first supply voltage (DVDD) may be similar to the upper boundary voltage at the second level (e.g., 2.5V) that is less than first level (e.g., 3.3V), the second reference voltage (REFN) may be similar to the second intermediate voltage (e.g., 1.8V), and the second supply voltage (DVSS) may be similar to the lower boundary voltage (e.g., 0V). Also, the first reference voltage (REFP) may be similar to the upper boundary voltage at the second level (e.g., 2.5V) minus the second intermediate voltage (e.g., 1.8V), which is (e.g., 0.7V).

In various implementations, during a third mode of operation, the first supply voltage (DVDD) may be similar to the upper boundary voltage at the third level (e.g., 1.8V) that is less than the second level (e.g., 2.5V), the second reference voltage (REFN) may be similar to the second intermediate voltage (e.g., 1.8V), and the second supply voltage (DVSS) may be similar to the lower boundary voltage (e.g., 0V). Also, in some instances, the first reference voltage (REFP) may be similar to the upper boundary voltage at the third level (e.g., 1.8V) minus the second intermediate voltage (e.g., 1.8V), which refers to the lower boundary voltage (e.g., 0V).

Figure 4A:
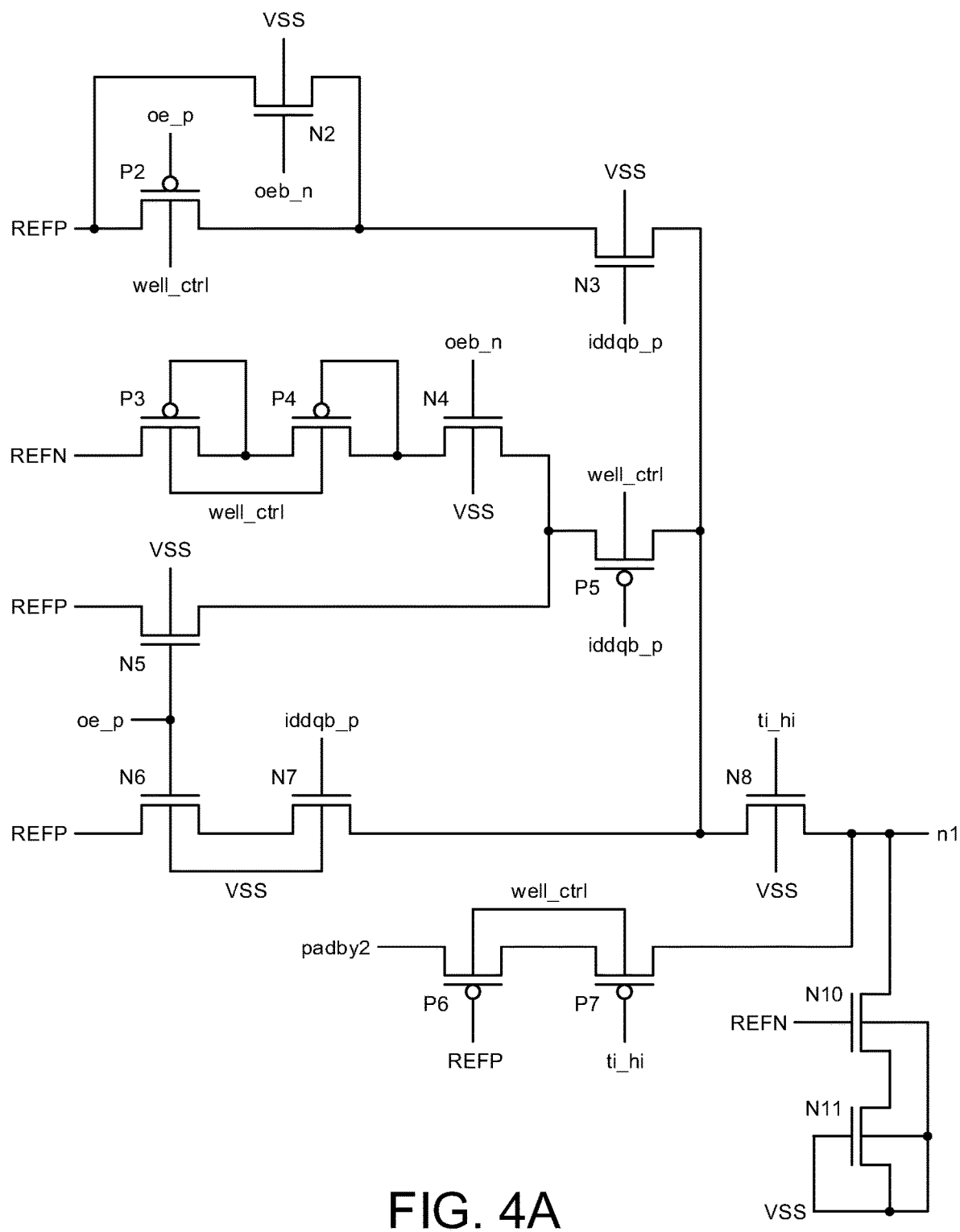
FIGS. 4A-4D illustrate diagrams of mode tracking circuitry in accordance with various implementations described herein.
Figure 4B:
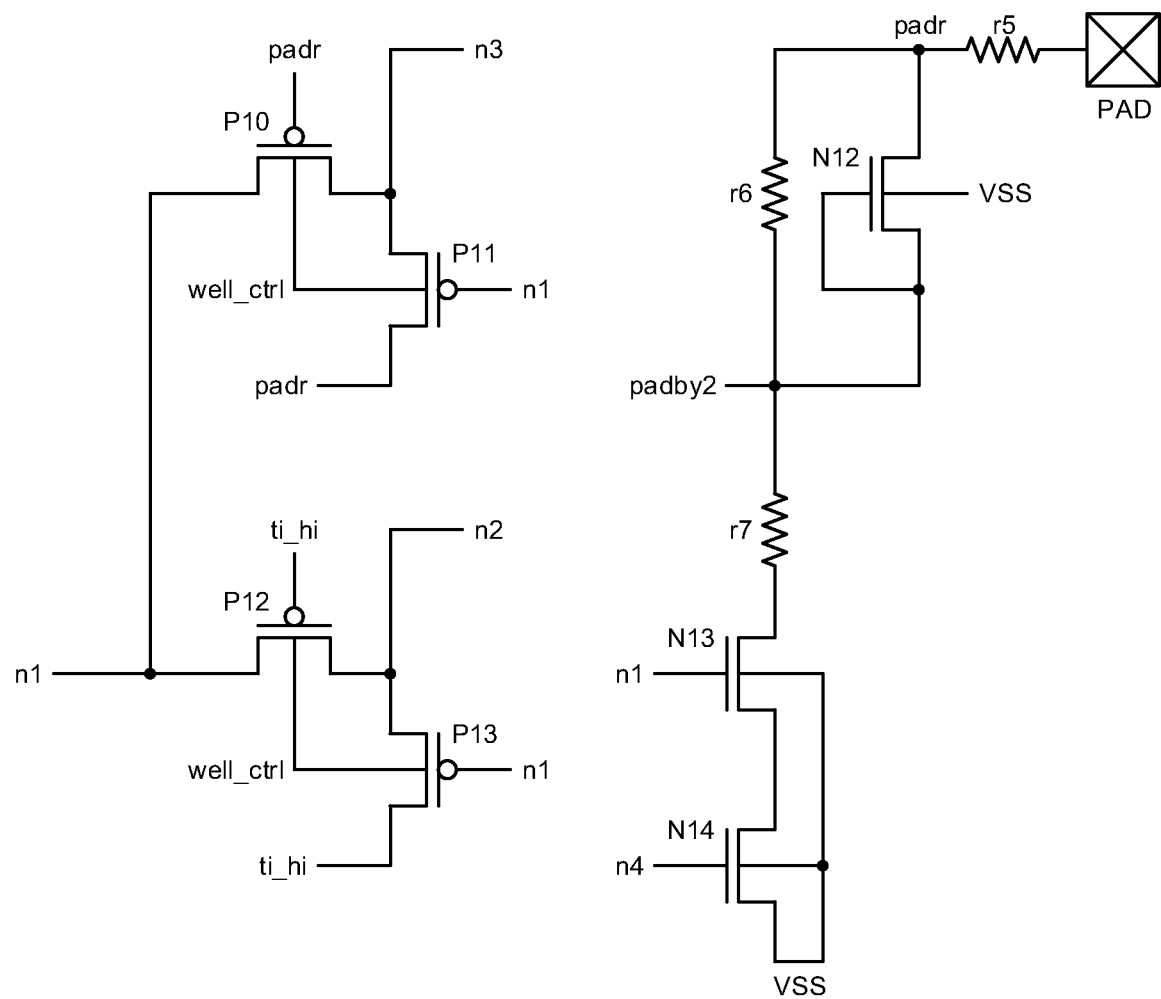
Figure 4C:
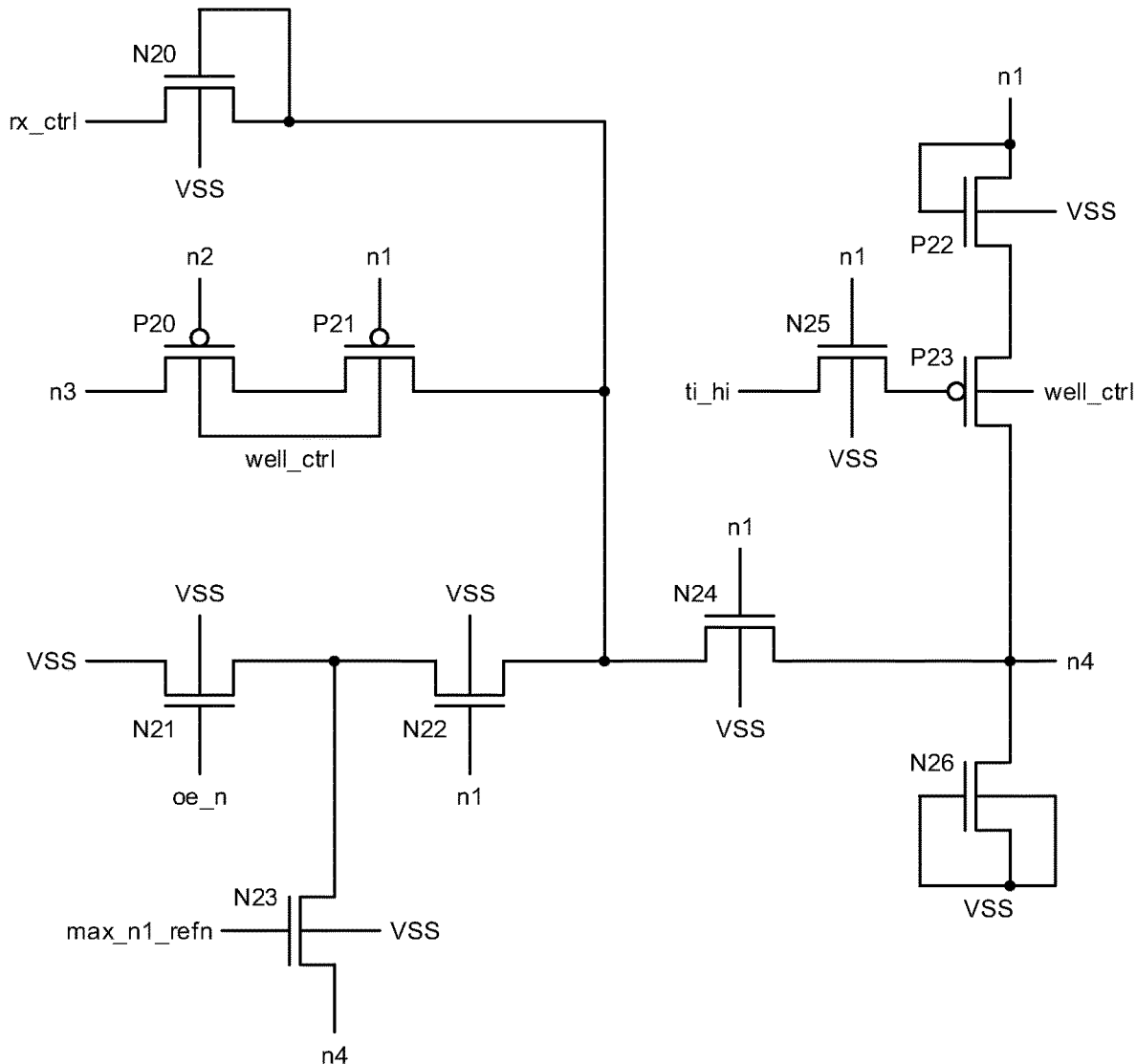
Figure 4D:
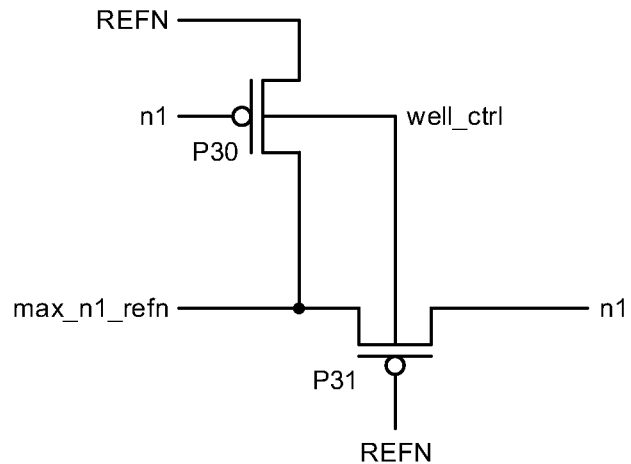
Figure 4D:
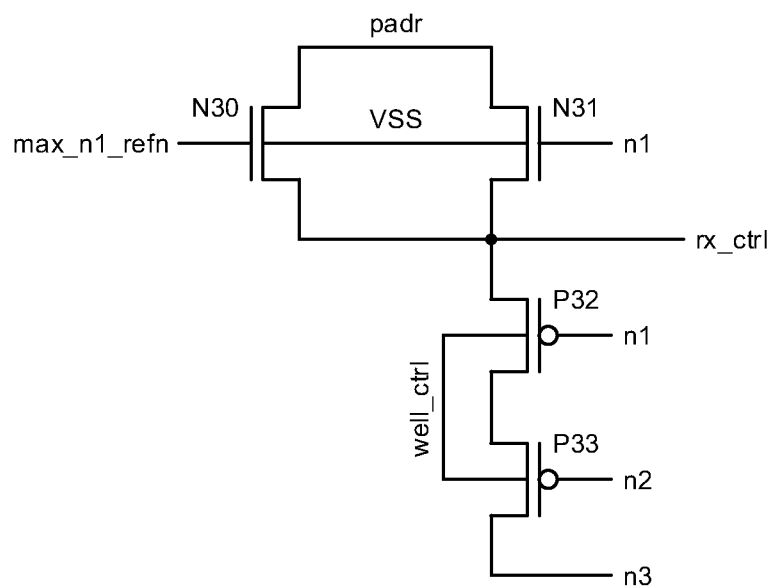

FIGS. 4A-4D illustrate diagrams of mode tracking circuitry 218 in accordance with various implementations described herein. In particular, FIG. 4A shows a diagram 400A of mode tracking circuitry 218A, FIG. 4B shows a diagram 400B of mode tracking circuitry 218B, FIG. 4C shows a diagram 400C of mode tracking circuitry 218C, and FIG. 4D shows a diagram 400D of mode tracking circuitry 218D.

FIGS. 4A-4D illustrate transistor-level diagrams 400A-400D of mode tracking circuitry 218A-218D. Various implementations described in reference to FIGS. 4A-4D may provide for mode tracking circuitry that uses various low voltage devices, such as, e.g., 1.8V transistor based devices, for IO buffer pad tracking circuitry that operates with power sequence independent fail-safe/tolerant support in different voltage level domains, such as, e.g., 3.3V/2.5V/1.8V voltage domains.

As shown in FIG. 4A, the mode tracking circuitry 218A may include multiple transistors of different types, such as, e.g., P-type transistors (P2, P3, P4, P5, P6, P7) and N-type transistors (N2, N3, N4, N5, N6, N7, N8, N10, N11), that are coupled together, arranged, and configured to operate as the mode tracking circuitry 218. Also, the mode tracking circuitry 218A may refer to node n1 tracking circuitry (i.e., n1_track).

In some implementations, transistors (P2, N2) are coupled in parallel between REFP and transistor (N3), wherein the oe_p signal is coupled to the gate of transistor (P2) with the well_ctrl signal coupled to the base terminal of transistor (P2), and wherein the oeb_n signal is coupled to the gate of transistor (N2) with the VSS signal (GND) coupled to the base terminal of transistor (N2). Also, transistor (N3) is coupled between transistor (P2) and transistor (N8), wherein the iddqb_p signal is coupled to the gate of transistor (N3) with the VSS signal (GND) coupled to the base terminal of transistor (N3).

In some implementations, transistors (P3, P4, N4) are coupled in series between REFN and transistor (P5), wherein transistors (P3, P4) are coupled as diodes with the well_ctrl signal coupled to base terminals of transistors (P3, P4), and wherein the oeb_n signal is coupled to the gate of transistor (N5) with the VSS signal (GND) coupled to the base terminal of transistor (N4). Also, transistor (N3) is coupled between REFP and transistor (P5), wherein the oe_p signal is coupled to the gate of transistor (N5) with the VSS signal (GND) coupled to the base terminal of transistor (N5). Also, in some instances, transistor (P5) is coupled between transistor (N4) and transistor (N8), wherein the iddqb_p signal is coupled to the gate of transistor (P5) with the well_ctrl signal coupled to the base terminal of transistor (P5).

In some implementations, transistors (N6, N7) are coupled in series between REFP and transistor (N8), wherein the oe_p signal is coupled to the gate of transistor (N6) with the VSS signal (GND) coupled to the base terminal of transistor (N6), and wherein the iddqb_p signal is coupled to the gate of transistor (N7) with the VSS signal (GND) coupled to the base terminal of transistor (N7). Also, transistor (N8) is coupled between transistor (N7) and node n1, wherein the ti_hi signal is coupled to the gate of transistor (N8) with the VSS signal (GND) coupled to the base terminal of transistor (N8).

In some implementations, transistors (P6, P7) are coupled in series between padby2 and node n1, wherein the REFP signal is coupled to the gate of transistor (P6) with the well_ctrl signal coupled to the base terminal of transistor (P6), and wherein the ti_hi signal is coupled to the gate of transistor (P7) with the well_ctrl signal coupled to the base terminal of transistor (P7). In some instances, transistors (N10, N11) are coupled in series between VSS and node n1, wherein the REFN signal is coupled to the gate of transistor (N10) with the VSS signal (GND) coupled to the base terminal of transistor (N10), and wherein the VSS signal (GND) is coupled to the gate of transistor (N11) with the VSS signal (GND) coupled to the base terminal of transistor (N11).

As shown in FIG. 4B, the mode tracking circuitry 218B may include multiple transistors of different types, such as, e.g., P-type transistors (P10, P11, P12, P13) and N-type transistors (N12, N13, N14), that are coupled together, arranged, and configured to operate as the mode tracking circuitry 218. Also, the mode tracking circuitry 218B may refer to node n1 tracking circuitry (i.e., n1_track).

In some implementations, transistor (P10) is coupled between node n1 and node n3, wherein the padr signal is coupled to the gate of transistor (P10) with the well_ctrl signal coupled to the base terminal of transistor (P10). Also, transistor (P11) is coupled between node padr and node n3, wherein the n1 signal is coupled to the gate of transistor (P11) with the well_ctrl signal coupled to the base terminal of transistor (P11).

Also, transistor (P12) is coupled between node n1 and node n2, wherein the ti_hi signal is coupled to the gate of transistor (P12) with the well_ctrl signal coupled to the base terminal of transistor (P12). Also, transistor (P13) is coupled between node ti_hi and node n2, wherein the n1 signal is coupled to the gate of transistor (P13) with the well_ctrl signal coupled to the base terminal of transistor (P13).

In some implementations, transistor (N12) is coupled between node padr and node padby2, wherein the padby2 signal is coupled to the gate of transistor (N12) with the VSS signal coupled to the base terminal of transistor (N12). The node padr is coupled to the PAD via a resistor (r5), and a resistor (r6) is coupled in parallel with transistor (N12) and between node padr and node padby2.

Also, transistors (N13, N14) are coupled between node padby2 and node VSS with a resistor (r7) coupled between node padby2 and transistor (N13), wherein the n1 signal is coupled to the gate of transistor (N13) with the VSS signal coupled to the base terminal of transistor (N13), and wherein the n4 signal is coupled to the gate of transistor (N14) with the VSS signal coupled to the base terminal of transistor (N14).

As shown in FIG. 4C, the mode tracking circuitry 218C may include multiple transistors of different types, such as, e.g., P-type transistors (P20, P21, P22, P23) and N-type transistors (N20, N21, N22, N23, N24, N25, N26), that are coupled together, arranged, and configured to operate as the mode tracking circuitry 218. Also, the mode tracking circuitry 218C may refer to node n4 tracking circuitry (i.e., n4_track).

In some implementations, transistor (N20) is coupled as a diode between the rx_ctrl signal and transistor (N24), wherein the VSS signal is coupled to the base terminal of transistor (N20). Also, transistors (P20, P21) are coupled in series between node n3 and transistor (N24), wherein the n2 signal is coupled to the gate of transistor (P20) with the well_ctrl signal coupled to the base terminal of transistor (P20), and wherein the n1 signal is coupled to the gate of transistor (P21) with the well_ctrl signal coupled to the base terminal of transistor (P21).

Also, transistors (N21, N22) are coupled in series between VSS and transistor (N24), wherein the oe_n signal is coupled to the gate of transistor (N21) with VSS coupled to the base terminal of transistor (N21), and wherein the n1 signal is coupled to the gate of transistor (N22) with VSS coupled to the base terminal of transistor (N22). In addition, in some instances, transistor (N23) is coupled between node (n4) and transistor (N22), wherein the max_n1_refn signal is coupled to the gate of transistor (N23) with the VSS signal coupled to the base terminal of transistor (N23). Also, transistor (N24) is coupled between transistor (N22) and node n4, wherein the n1 signal is coupled to the gate of transistor (N24) with VSS coupled to the base terminal of transistor (N24).

Also, transistors (P22, P23) are coupled in series between node n1 and node n4, wherein the n1 signal is coupled to the gate of transistor (P22) with VSS coupled to the base terminal of transistor (P22), wherein transistor (N25) is coupled between the ti_hi signal and the gate of transistor (P23), and wherein the well_ctrl signal is coupled to the base terminal of transistor (P23). Also, the n1 signal is coupled to the gate of transistor (N25) with VSS coupled to the base terminal of transistor (N25). Also, transistor (N26) is coupled between node n4 and VSS, wherein the VSS signal is coupled to the gate of transistor (N26) with VSS coupled to the base terminal of transistor (N26).

As shown in FIG. 4D, the mode tracking circuitry 218D may include multiple transistors of different types, such as, e.g., P-type transistors (P30, P31, P32, P33) and N-type transistors (N30, N31), that are coupled together, arranged, and configured to operate as the mode tracking circuitry 218. Also, the mode tracking circuitry 218D may refer to receiver (Rx) control tracking circuitry (i.e., rx_ctrl_track).

In some implementations, transistor (P30) is coupled between node REFN and transistor (P31), wherein the n1 signal is coupled to the gate of transistor (P30), and wherein the well_ctrl signal is coupled to the base terminal of transistor (P30). Also, in some instances, transistor (P31) is coupled between transistor (P30), wherein the REFN signal is coupled to the gate of transistor (P31) with the well_ctrl signal coupled to the base terminal of transistor (P31). In addition, in some instances, the max_n1_refn signal is coupled to a node disposed between transistors (P30, P31).

Also, transistors (N30, N31) are coupled in parallel between node padr and node rx_ctrl, wherein the max_n1_refn signal is coupled to the gate of transistor (N30) with the VSS signal coupled to the base terminal of transistor (N30), and wherein the n1 signal is coupled to the gate of transistor (N31) with the VSS signal coupled to the base terminal of transistor (N31). Also, in some instances, transistors (P32, P33) are coupled in series between node rx_ctrl and node n3, wherein the n1 signal is coupled to the gate of transistor (P32) with the well_ctrl signal coupled to the base terminal of transistor (P32), and wherein the n2 signal is coupled to the gate of transistor (P33) with the well_ctrl signal coupled to the base terminal of transistor (P33).

Figure 5A:
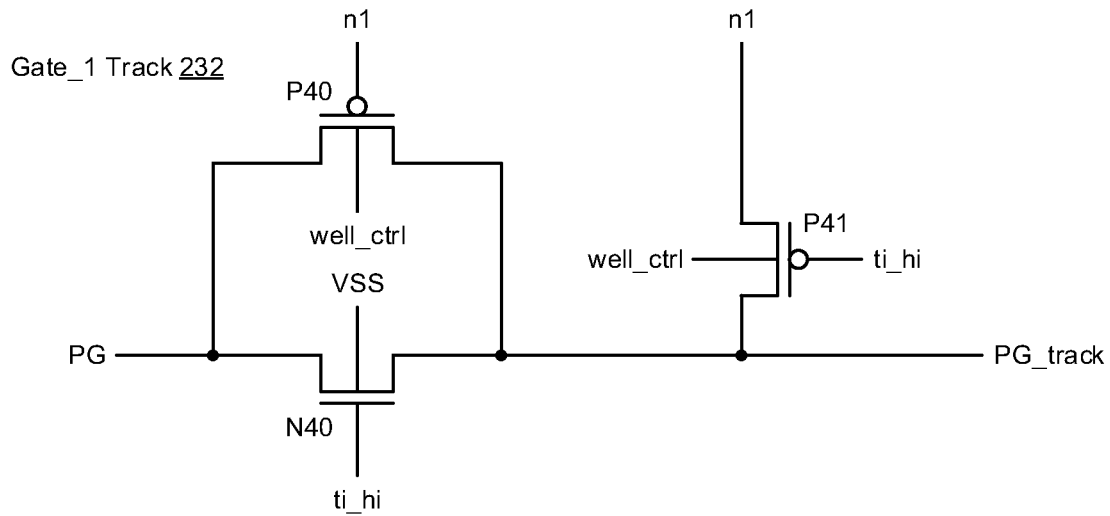
FIGS. 5A-5B illustrate diagrams of gate tracking circuitry in accordance with various implementations described herein.
Figure 5A:
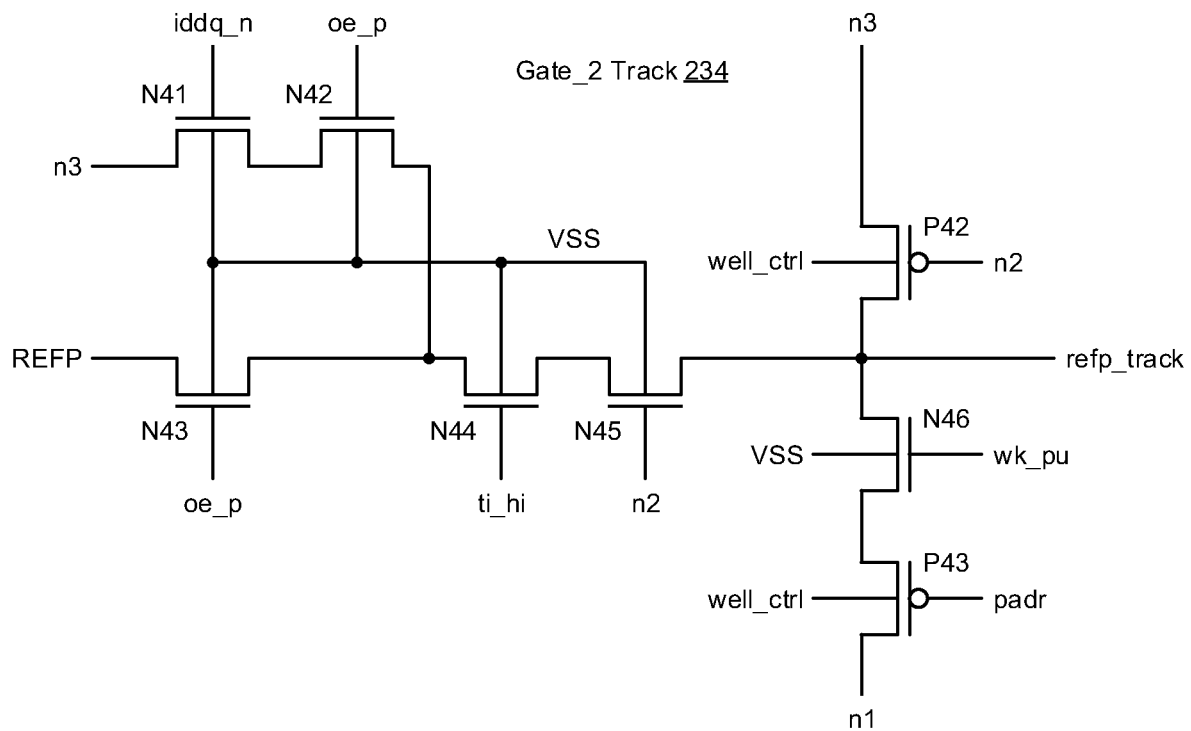
Figure 5B:
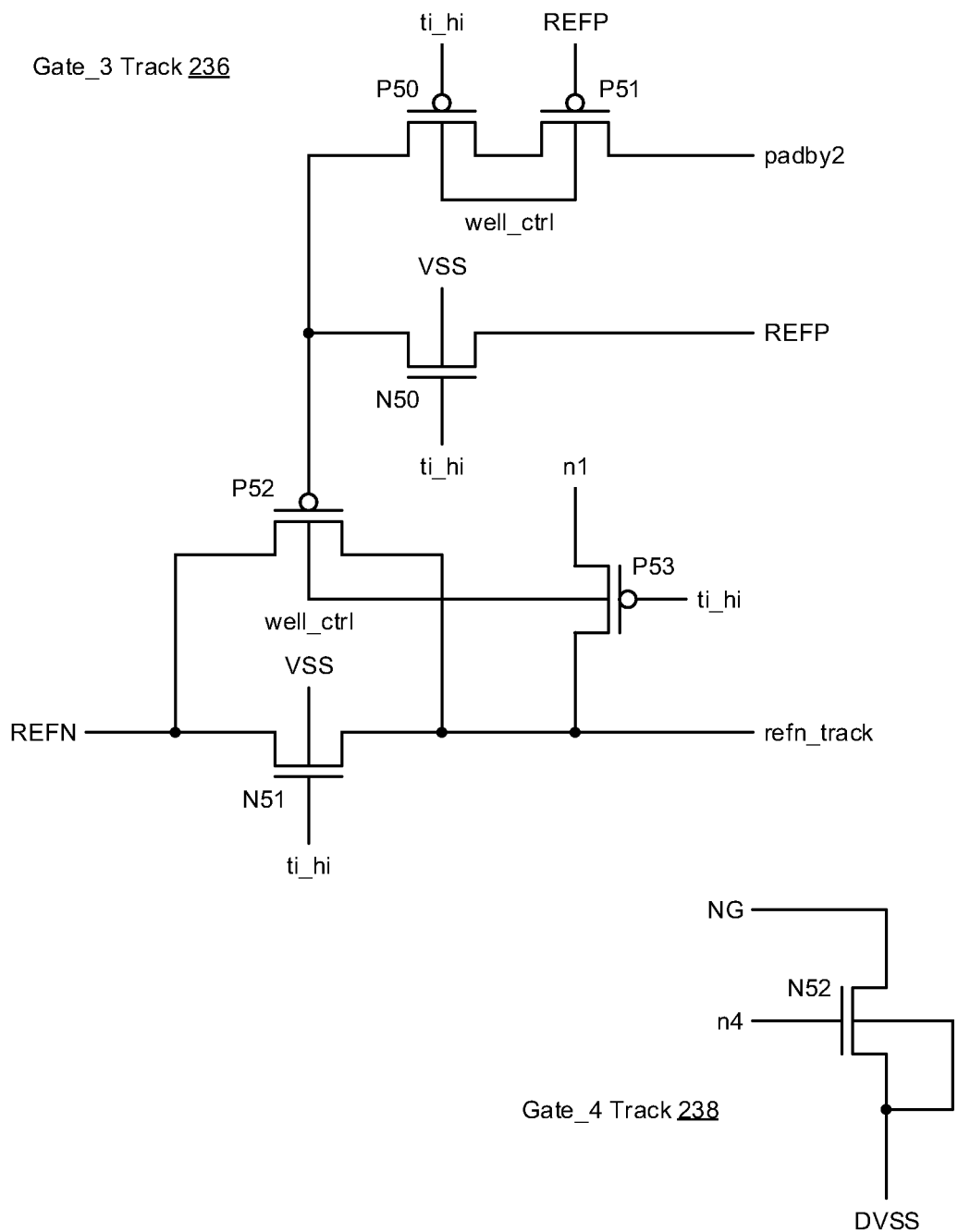

FIGS. 5A-5B illustrate diagrams of gate tracking circuitry 220 in accordance with various implementations described herein. In particular, FIG. 5A shows a diagram 500A of gate tracking circuitry 220A, and FIG. 5B shows another diagram 500B of gate tracking circuitry 220B.

FIGS. 5A-5B illustrate transistor-level diagrams 500A-500B of gate tracking circuitry 220A-220B. Various implementations described in reference to FIGS. 5A-5B may provide for the gate tracking circuitry that uses various low voltage devices, such as, e.g., 1.8V transistor based devices, for IO buffer pad tracking circuitry that operates with power sequence independent fail-safe/tolerant support in different voltage level domains, such as, e.g., 3.3V/2.5V/1.8V voltage domains.

As shown in FIG. 5A, the gate tracking circuitry 220A may include multiple transistors of different types, such as, e.g., P-type transistors (P40, P41, P42, P43) and N-type transistors (N41, N42, N43, N44, N45, N46), that are coupled together, arranged, and configured to operate as the gate tracking circuitry 220. Further, the gate tracking circuitry 220A may refer to first gate tracking circuitry (i.e., Gate_1 Track) 232 and second gate tracking circuitry (i.e., Gate_2 Track) 234.

In various implementations, transistors (P40, N40) may be coupled in parallel between node PG and node PG_track, wherein the n1 signal is coupled to the gate of transistor (P40) with the well_ctrl signal coupled to the base terminal of transistor (P40), and wherein the ti_hi signal is coupled to the gate of transistor (N40) with the VSS signal (GND) coupled to the base terminal of transistor (N40). Also, in some instances, transistor (P41) may be coupled between node n1 and node PG_track, wherein the ti_hi signal is coupled to the gate of transistor (P41) with the well_ctrl signal coupled to the base terminal of transistor (P41).

In some implementations, transistors (N41, N42) are coupled in series between node n3 and transistor (N44), wherein the iddq_n signal is coupled to the gate of transistor (N41) with VSS coupled to the base terminal of transistor (N41), and wherein the oe_p signal is coupled to the gate of transistor (N42) with VSS coupled to the base terminal of transistor (N42). Also, transistors (N43, N44, N45) are coupled in series between node REFP and node refp_track, wherein the oe_p signal is coupled to the gate of transistor (N43) with VSS coupled to the base terminal of transistor (N43), and wherein the ti_hi signal is coupled to the gate of transistor (N44) with VSS coupled to the base terminal of transistor (N44), and wherein the n2 signal is coupled to the gate of transistor (N45) with VSS coupled to the base terminal of transistor (N45).

Also, transistor (P42) is coupled between node n3 and node refp_track, wherein the n2 signal is coupled to the gate of transistor (P42) with well_ctrl coupled to the base terminal of transistor (P42). Also, in some instances, transistors (N46, P43) are coupled in series between node n1 and node refp_track, wherein the wk_pu signal is coupled to the gate of transistor (N46) with VSS coupled to the base terminal of transistor (N46), and wherein the padr signal is coupled to the gate of transistor (P43) with the well_ctrl signal coupled to the base terminal of transistor (P43).

As shown in FIG. 5B, the gate tracking circuitry 220B may include multiple transistors of different types, such as, e.g., P-type transistors (P50, P51, P52, P53) and N-type transistors (N50, N51, N52), that are coupled together, arranged, and configured to operate as the gate tracking circuitry 220. Further, the gate tracking circuitry 220B may refer to third gate tracking circuitry (i.e., Gate_3 Track) 236 and also fourth gate tracking circuitry (i.e., Gate_4 Track) 238.

In some implementations, transistors (P50, P51) are coupled in series between node padby2 and the gate of transistor (P52), wherein the ti_hi signal is coupled to the gate of transistor (P50) with the well_ctrl signal coupled to the base terminal of transistor (P50), and wherein the REFP signal is coupled to the gate of transistor (P51) with the well_ctrl signal coupled to the base terminal of transistor (P51). Also, transistor (N50) is coupled between node REFP and the gate of transistor (P52), wherein the ti_hi signal is coupled to the gate of transistor (N50) with VSS coupled to the base terminal of transistor (N50). Also, transistors (P52, N51) are coupled in parallel between node REFN and the node refn_track, wherein the well_ctrl signal coupled to the base terminal of transistor (P52), and wherein the ti_hi signal is coupled to the gate of transistor (N51) with VSS coupled to the base terminal of transistor (N51). Also, transistor (P53) is coupled between node n1 and node refn_track, wherein the ti_hi signal is coupled to the gate of transistor (P53) with the well_ctrl signal coupled to the base terminal of transistor (P53).

In some implementations, transistor (N52) is coupled between node NG and node DVSS, wherein the n4 signal is coupled to the gate of transistor (N52) with the DVSS signal coupled to the base terminal of transistor (N52). In some instances, the transistor (N52) may be coupled together as a diode.

Figure 6A:
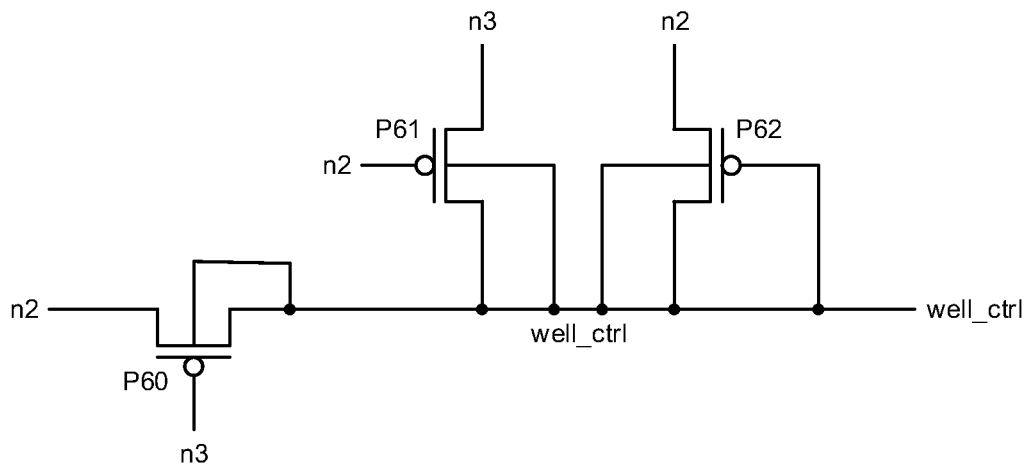
FIGS. 6A-6B illustrate diagrams of Nwell tracking circuitry and receiver input tracking circuitry in accordance with various implementations described herein.
Figure 6B:
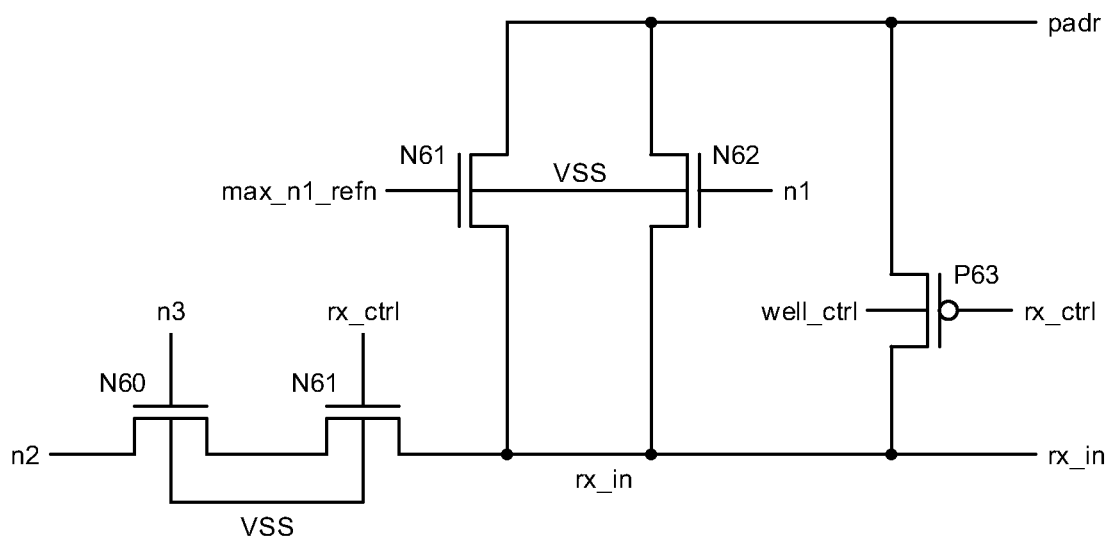

FIGS. 6A-6B illustrate transistor-level diagrams of Nwell tracking circuitry 228 and receiver (Rx) input tracking circuitry 248 in accordance with various implementations described herein. In particular, FIG. 6A shows a transistor-level diagram 600A of Nwell tracking circuitry 228, and FIG. 6B shows a transistor-level diagram 600B of Rx input tracking circuitry 248. Various implementations described in reference to FIGS. 6A-6B may provide for Nwell and Rx input tracking circuitry that uses various low voltage devices, such as, e.g., 1.8V transistor based devices, for the IO buffer pad tracking circuitry that operates with power sequence independent fail-safe/tolerant support in different voltage level domains, such as, e.g., 3.3V/2.5V/1.8V voltage domains.

As shown in FIG. 6A, the Nwell tracking circuitry 228 may include multiple transistors of a P-type, such as, e.g., P-type transistors (P60, P61, P62), that are coupled together, arranged, and configured to operate as the Nwell tracking circuitry 228.

In some implementations, transistor (P60) may be coupled between node n2 and node well_ctrl, wherein the n3 signal is coupled to the gate of transistor (P60) with the well_ctrl signal coupled to the base terminal of transistor (P60). Also, transistor (P61) may be coupled between node n3 and node well_ctrl, wherein the n2 signal is coupled to the gate of transistor (P61) with the well_ctrl signal coupled to the base terminal of transistor (P61). Also, in some instances, transistor (P62) may be coupled between node n2 and node well_ctrl, wherein the well_ctrl signal is coupled to the gate of transistor (P62) with the well_ctrl signal coupled to the base terminal of transistor (P62).

As shown in FIG. 6B, the Rx input tracking circuitry 248 may include multiple transistors of different types, such as, e.g., P-type transistors (P63) and N-type transistors (N60, N61, N62), that are coupled together, arranged, and configured to operate as the Rx input tracking circuitry 248.

In some implementations, transistors (N60, N61) may be coupled in series between node n2 and node rx_in, wherein the n3 signal is coupled to the gate of transistor (N60) with VSS coupled to the base terminal of transistor (N60), and wherein the rx_ctrl signal is coupled to the gate of transistor (N61) with VSS coupled to the base terminal of transistor (N61). Also, in some instances, transistors (N61, N62, P63) may be coupled in parallel between node padr and node rx_in. For instance, transistor (N61) may be coupled between node padr and node rx_in, wherein the max_n1_refn signal is coupled to the gate of transistor (N61) with VSS coupled to the base terminal of transistor (N61). Also, transistor (N62) may be coupled between node padr and node rx_in, wherein the n1 signal is coupled to the gate of transistor (N62) with VSS coupled to the base terminal of transistor (N62). Also, in some instances, transistor (P63) may be coupled between node padr and node rx_in, wherein the rx_ctrl signal is coupled to the gate of transistor (P63) with the well_ctrl signal coupled to the base terminal of transistor (P63).

Figure 7:
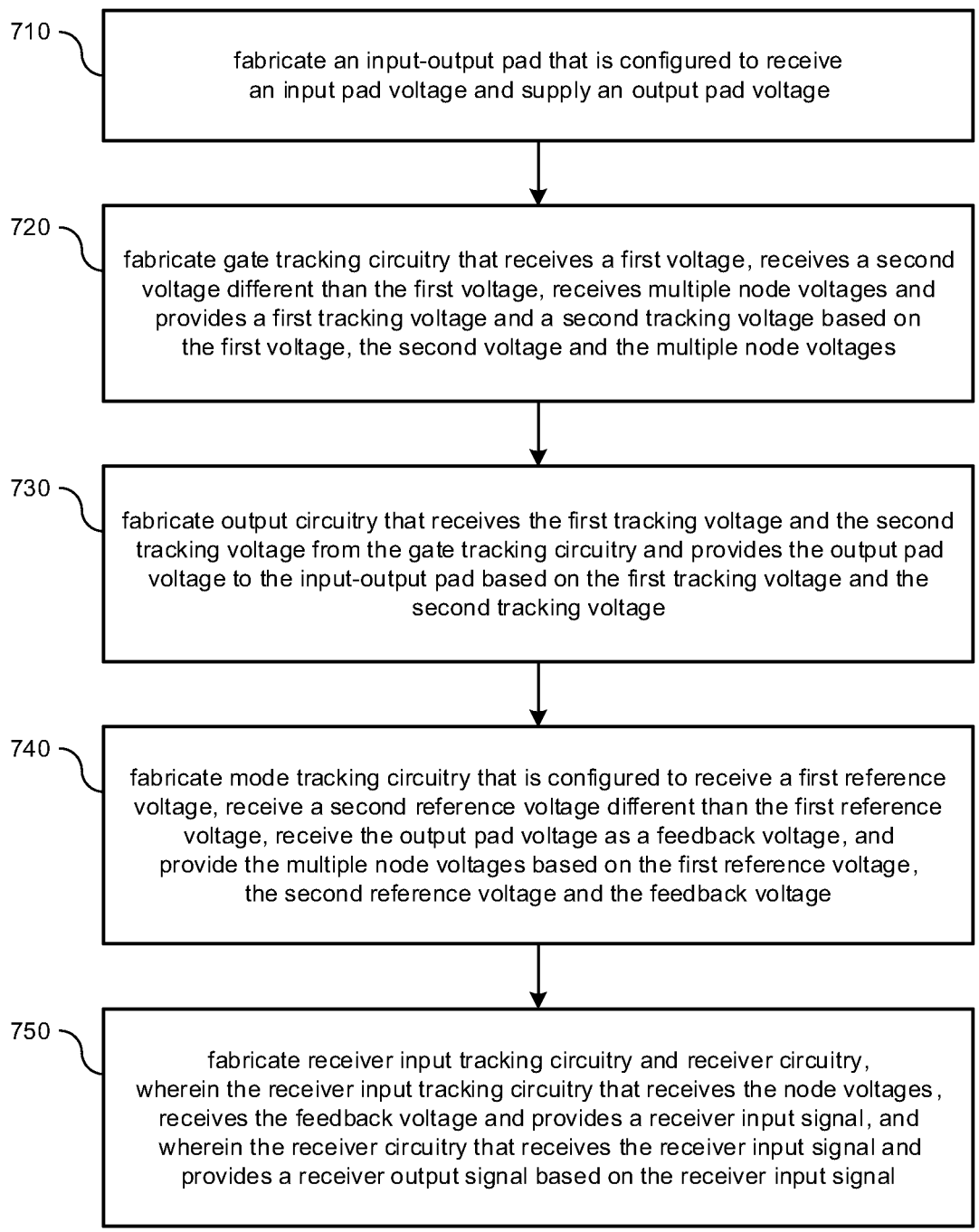
FIG. 7 illustrates a diagram of a method for providing input-output (IO) buffer pad tracking circuitry in accordance with various implementations described herein.

FIG. 7 illustrates a process diagram of a method 700 for providing IO buffer pad tracking circuitry in accordance with various implementations described herein.

It should be understood that even though method 700 indicates a particular order of operation execution, in some cases, various certain portions of the operations may be executed in a different order, and on different systems. In other cases, additional operations and/or steps may be added to and/or omitted from method 700. Also, method 700 may be implemented in hardware and/or software. If implemented in hardware, the method 700 may be implemented with various components and/or circuitry, as described herein in reference to FIGS. 1-6B. Also, if implemented in software, method 700 may be implemented as a program and/or software instruction process configured for providing IO buffer pad tracking techniques, as described herein. Also, if implemented in software, instructions related to implementing the method 700 may be stored in memory and/or a database. In various instances, a computer or various other types of computing devices having a processor and memory may be configured to perform method 700.

In various implementations, method 700 may refer to a method of designing, providing, building and/or manufacturing IO buffer pad tracking circuitry as an integrated system, device and/or circuit that may involve use of the various IC circuit components described herein so as to thereby implement IO buffer pad tracking techniques associated therewith. The IO buffer pad tracking circuitry may be integrated with computing circuitry and related components on a single chip, and the IO buffer pad tracking circuitry may be implemented in various embedded systems for various electronic, mobile and Internet-of-things (IoT) applications, including sensor nodes.

At block 710, method 700 may fabricate an input-output pad that is configured to receive an input-output pad voltage and supply an input-output pad voltage. At block 720, method 700 may fabricate gate tracking circuitry that receives a first voltage, receives a second voltage different than the first voltage, receives node voltages and provides a first tracking voltage and a second tracking voltage based on the first voltage, the second voltage and the node voltages. At block 730, method 700 may fabricate output circuitry that receives the first tracking voltage and the second tracking voltage from the gate tracking circuitry and provides the input-output pad voltage to the input-output pad based on the first tracking voltage and the second tracking voltage.

At block 740, method 700 may fabricate mode tracking circuitry configured to receive a first reference voltage, receive a second reference voltage different than the first reference voltage, receive the input-output pad voltage as a feedback voltage, and provide the node voltages based on the first reference voltage, the second reference voltage and the feedback voltage. At block 750, method 700 may fabricate receiver input tracking circuitry and receiver circuitry. In some instances, the receiver input tracking circuitry may receive the node voltages, receive the input-output pad voltage and provide a receiver input signal. Also, in some instances, the receiver circuitry may receive the receiver input signal and provide a receiver output signal based on the receiver input signal.

In some implementations, the first voltage may refer to a first operating voltage within a first range, and the second voltage may refer to a second operating voltage within a second range that is different than the first range. In addition, the first reference voltage may be associated with the first operating voltage, and the second reference voltage may be associated with the second operating voltage. The gate tracking circuitry may receive the first reference voltage, receive the second reference voltage different than the first reference voltage, receive the feedback voltage and provide a first reference tracking voltage and a second reference tracking voltage based on the first reference voltage, the second reference voltage, the feedback voltage and the node voltages. Also, the output circuitry may have multiple transistors coupled between the gate tracking circuitry and the input-output pad, and in addition, the multiple transistors include a first transistor, a second transistor, a third transistor and a fourth transistor.

In various implementations, method 700 may fabricate N-well tracking circuitry that is configured to receive one or more of the node voltages and provide a well control signal to a base terminal of the first transistor and/or the second transistor of the output circuitry. Also, the gate tracking circuitry may have first gate tracking circuitry and second gate tracking circuitry. In some instances, the first gate tracking circuitry receives the first voltage, receives one or more of the nodes voltages and provides the first tracking voltage to a gate of the first transistor in the output circuitry. Also, in some instances, the second gate tracking circuitry receives the first reference voltage, receives one or more of the nodes voltages and then provides the first reference tracking voltage to a gate of the second transistor in the output circuitry. Further, the gate tracking circuitry may include third gate tracking circuitry and fourth gate tracking circuitry. In some instances, the third gate tracking circuitry receives the second reference voltage, receives one or more of the nodes voltages and provides the second reference tracking voltage to a gate of the third transistor in the output circuitry. Also, in some instances, the fourth gate tracking circuitry receives the second voltage, receives one or more of the nodes voltages and provides the second tracking voltage to a gate of the fourth transistor in the output circuitry.

In various implementations, the first transistor may be coupled between a first supply voltage and the second transistor, and also, the second transistor may be coupled between the first transistor and the third transistor. In some instances, the third transistor may be coupled between the second transistor and the fourth transistor, and the fourth transistor may be coupled between the third transistor and a second supply voltage that is different than the first supply voltage.

In some implementations, the input-output pad may be coupled to a node that is disposed between the second transistor and the third transistor. Also, the first supply voltage may be provided to the input-output pad as the input-output pad voltage when the first transistor and the second transistor are activated and when at least one of the third transistor and the fourth transistor are deactivated. Also, the second supply voltage may be provided to the input-output pad as the input-output pad voltage when at least one of the first transistor and the second transistor are deactivated and when the third transistor and the fourth transistor are activated.

In some implementations, the input-output pad may be coupled to a node that is disposed between the second transistor and the third transistor. Also, the input-output pad may be charged to the first supply voltage when the first transistor and/or the second transistor are activated and/or when at least one of the third transistor and/or the fourth transistor are deactivated. Also, the input-output pad may be discharged to the second supply voltage when at least one of the first transistor and the second transistor are deactivated and when the third transistor and the fourth transistor are activated.

In some implementations, the first supply voltage is between a first intermediate voltage (e.g., 1.5V, 0.7V, 0V) and an upper boundary voltage (e.g., 3.3V, 2.5V, 1.8V), and also, the second supply voltage may be between a lower boundary voltage (e.g., 0V) and a second intermediate voltage (e.g., 1.8V). Also, in some instances, during a fail-safe condition, the first supply voltage may be similar to the lower boundary voltage (e.g., 0V), and/or the input-output pad voltage may be similar to the upper boundary voltage (e.g., 3.3V).

In various implementations, during a tolerant condition, the first supply voltage may be similar to the upper boundary voltage at the third level (e.g., 1.8V) that is less than the second level (e.g., 2.5V), the second reference voltage may be similar to the second intermediate voltage (e.g., 1.8V), and the second supply voltage may be similar to the lower boundary voltage (e.g., 0V). Also, in various instances, the first reference voltage may be similar to the upper boundary voltage at the third level (e.g., 1.8V) minus the second intermediate voltage (e.g., 1.8V), which refers to the lower boundary voltage (e.g., 0V), and the input-output pad voltage may be similar to the upper boundary voltage at the first level (e.g., 3.3V).

In various implementations, during a tolerant condition, the first supply voltage may be similar to the upper boundary voltage at the third level (e.g., 1.8V) that is less than the second level (e.g., 2.5V), the second reference voltage may be similar to the second intermediate voltage (e.g., 1.8V), and the second supply voltage may be similar to the lower boundary voltage (e.g., 0V). Also, in various instances, the first reference voltage may be similar to the upper boundary voltage at the third level (e.g., 1.8V) minus the second intermediate voltage (e.g., 1.8V), which refers to the lower boundary voltage (e.g., 0V), and the input-output pad voltage may be similar to the upper boundary voltage at the second level (e.g., 2.5V).

In various implementations, during a tolerant condition, the first supply voltage may be similar to the upper boundary voltage at the second level (e.g., 2.5V) that is less than the first level (e.g., 3.3V), the second reference voltage may be similar to the second intermediate voltage (e.g., 1.8V), and the second supply voltage may be similar to the lower boundary voltage (e.g., 0V). Also, in various instances, the first reference voltage may be similar to the upper boundary voltage at the second level (e.g., 2.5V) minus the second intermediate voltage (e.g., 1.8V), which refers to the lower boundary voltage (e.g., 0.7V), and the input-output pad voltage may be similar to the upper boundary voltage at the first level (e.g., 3.3V).

In various implementations, during a first mode of operation, the first supply voltage (DVDD) may be similar to the upper boundary voltage at the first level (e.g., 3.3V), the second reference voltage may be similar to the second intermediate voltage (e.g., 1.8V), and the second supply voltage (DVSS) may be similar to the lower boundary voltage (e.g., 0V). Also, the first reference voltage (e.g., REFP) may be similar to the upper boundary voltage at the first level (e.g., 3.3V) minus the second intermediate voltage (e.g., 1.8V), which refers to the first intermediate voltage (e.g., 1.5V)

In various implementations, during a second mode of operation, the first supply voltage (DVDD) may be similar to the upper boundary voltage at the second level (e.g., 2.5V) that is less than the first level (e.g., 3.3V), the second reference voltage (REFN) may be similar to the second intermediate voltage (e.g., 1.8V). Also, in various instances, the second supply voltage (DVSS) may be similar to the lower boundary voltage (e.g., 0V). In various instances, the first reference voltage (REFP) may be similar to the upper boundary voltage at the second level (e.g., 2.5V) minus the second intermediate voltage (e.g., 1.8V), which is (e.g., 0.7V).

In various implementations, during a third mode of operation, the first supply voltage (DVDD) may be similar to the upper boundary voltage at the third level (e.g., 1.8V) that is less than the second level (e.g., 2.5V), the second reference voltage (REFN) may be similar to the second intermediate voltage (e.g., 1.8V). Also, in some instances, the second supply voltage (DVSS) may be similar to the lower boundary voltage (e.g., 0V). Further, in some instances, the first reference voltage (REFP) may be similar to the upper boundary voltage at the third level (e.g., 1.8V) minus the second intermediate voltage (e.g., 1.8V), which refers to the lower boundary voltage (e.g., 0V).

Various implementations described herein are directed to IO buffer pad tracking schemes and techniques that may provide various advantages. For instance, overdrive operation (e.g., 3.3V/2.5V/1.8V) may include fail-safe support using 1.8V devices, wherein overdrive operation is 1.8V tolerant to 3.3V/2.5V, and wherein overdrive operation is also 2.5V tolerant to 3.3V. Also, the IO buffer pad tracking schemes and techniques described herein may provide power sequence independent circuitry with high speed fail-safe cum tolerant support in various overdrive related applications.

Described herein are various implementations of a device. The device may include an input-output pad that is configured to receive an input pad voltage and supply an input-output pad voltage. The device may include gate tracking circuitry that receives a first voltage, receives a second voltage different than the first voltage, receives node voltages and provides a first tracking voltage and a second tracking voltage based on the first voltage, the second voltage and the node voltages. The device may include output circuitry that receives the first tracking voltage and the second tracking voltage from the gate tracking circuitry and provides the input-output pad voltage to the input-output pad based on the first tracking voltage and the second tracking voltage.

Described herein are various implementations of a device. The device may include an output stage having output transistors that receive tracking signals and provide an input-output pad voltage to an input-output pad based on the tracking signals. The device may have a gate tracking stage that receives operational voltages, receives node voltages and provides the tracking signals to the output transistors based on the operational voltages and the node voltages. The device may include a mode tracking stage that receives the operational voltages, receives the input-output pad voltage as a feedback voltage, and provides the node voltages to the gate tracking stage based on the operational voltages and the feedback voltage.

Described herein are various implementations of a method. The method may fabricate an input-output pad that is configured to receive an input pad voltage and supply an input-output pad voltage. The method may fabricate gate tracking circuitry that receives a first voltage, receives a second voltage different than the first voltage, receives node voltages and provides a first tracking voltage and a second tracking voltage based on the first voltage, the second voltage and the node voltages. The method may fabricate output circuitry that receives the first tracking voltage and the second tracking voltage from the gate tracking circuitry and provides the input-output pad voltage to the input-output pad based on the first tracking voltage and the second tracking voltage.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. device comprising:
an input-output pad that is configured to receive and supply an input-output pad voltage;
gate tracking circuitry that receives a first voltage, receives a second voltage different than the first voltage, receives node voltages and provides a first tracking voltage and a second tracking voltage based on the first voltage, the second voltage and the node voltages;
output circuitry that receives the first tracking voltage and the second tracking voltage from the gate tracking circuitry and provides the input-output pad voltage to the input-output pad based on the first tracking voltage and the second tracking voltage;
receiver input tracking circuitry that receives the node voltages, receives the input-output pad voltage and provides a receiver input signal; and
receiver circuitry that receives the receiver input signal and provides a receiver output signal based on the receiver input signal.

2. The device of clam 1, further comprising:
mode tracking circuitry that is configured to receive a first reference voltage, receive a second reference voltage different than the first reference voltage, receive the input-output pad voltage as a feedback voltage, and provide the node voltages based on the first reference voltage, the second reference voltage and the feedback voltage.

3. The device of claim 2, wherein:
the first voltage refers to a first operating voltage in a first range,
the second voltage refers to a second operating voltage in a second range different than the first range,
the first reference voltage is associated with the first operating voltage, and
the second reference voltage is associated with the second operating voltage.

4. The device of claim 2, wherein:
the gate tracking circuitry also receives the first reference voltage, receives the second reference voltage different than the first reference voltage, receives the feedback voltage and provides a first reference tracking voltage and a second reference tracking voltage based on the first reference voltage, the second reference voltage, the feedback voltage and the node voltages.

5. The device of claim 4, wherein:
the output circuitry has multiple transistors coupled between the gate tracking circuitry and the input-output pad, and
the multiple transistors include a first transistor, a second transistor, a third transistor and a fourth transistor.

6. The device of claim 5, further comprising:
N-well tracking circuitry that receives one or more of the node voltages and provides a well control signal to a base terminal of the first transistor and the second transistor of the output circuitry.

7. The device of claim 6, wherein:
the gate tracking circuitry includes first gate tracking circuitry and second gate tracking circuitry,
the first gate tracking circuitry receives the first voltage, receives one or more of the nodes voltages and provides the first tracking voltage to a gate of the first transistor in the output circuitry, and
the second gate tracking circuitry receives the first reference voltage, receives one or more of the nodes voltages and provides the first reference tracking voltage to a gate of the second transistor in the output circuitry.

8. The device of claim 5, wherein:
the gate tracking circuitry includes third gate tracking circuitry and fourth gate tracking circuitry,
the third gate tracking circuitry receives the second reference voltage, receives one or more of the nodes voltages and provides the second reference tracking voltage to a gate of the third transistor in the output circuitry, and
the fourth gate tracking circuitry receives the second voltage, receives one or more of the nodes voltages and provides the second tracking voltage to a gate of the fourth transistor in the output circuitry.

9. The device of claim 5, wherein:
the first transistor is coupled between a first supply voltage and the second transistor,
the second transistor is coupled between the first transistor and the third transistor,
the third transistor is coupled between the second transistor and the fourth transistor, the fourth transistor is coupled between the third transistor and a second supply voltage different than the first supply voltage.

10. The device of claim 9, wherein:
the input-output pad is coupled to a node disposed between the second transistor and the third transistor,
the first supply voltage is provided to the input-output pad as the input-output pad voltage when the first transistor and the second transistor are activated and when at least one of the third transistor and the fourth transistor are deactivated, and
the second supply voltage is provided to the input-output pad as the input-output pad voltage when at least one of the first transistor and the second transistor are deactivated and when the third transistor and the fourth transistor are activated.

11. The device of claim 9, wherein:
the input-output pad is coupled to a node disposed between the second transistor and the third transistor,
the input-output pad is charged to the first supply voltage when the first transistor and the second transistor are activated and when at least one of the third transistor and the fourth transistor are deactivated, and
the input-output pad is discharged to the second supply voltage when at least one of the first transistor and the second transistor are deactivated and when the third transistor and the fourth transistor are activated.

12. The device of claim 9, wherein:
the first supply voltage is between a first intermediate voltage and an upper boundary voltage, and
the second supply voltage is between a lower boundary voltage and a second intermediate voltage.

13. The device of claim 12, wherein during a fail-safe condition, the first supply voltage may be similar to the lower boundary voltage, and the input-output pad voltage may be similar to the upper boundary voltage.

14. The device of claim 12, wherein:
during a tolerant condition, the first supply voltage may be similar to the upper boundary voltage at a third level that is less than the second level, the second reference voltage may be similar to the second intermediate voltage, and the second supply voltage may be similar to the lower boundary voltage, and
the first reference voltage may be similar to the upper boundary voltage at the third level minus the second intermediate voltage, which refers to the lower boundary voltage, and
the input-output pad voltage may be similar to the upper boundary voltage at a first level.

15. The device of claim 12, wherein:
during a tolerant condition, the first supply voltage may be similar to the upper boundary voltage at a third level that is less than the second level, the second reference voltage may be similar to the second intermediate voltage, and the second supply voltage may be similar to the lower boundary voltage, and
the first reference voltage may be similar to the upper boundary voltage at the third level minus the second intermediate voltage, which refers to the lower boundary voltage, and
the input-output pad voltage may be similar to the upper boundary voltage at a second level.

16. The device of claim 12, wherein:
during a tolerant condition, the first supply voltage may be similar to the upper boundary voltage at a second level that is less than the first level, the second reference voltage may be similar to the second intermediate voltage, and the second supply voltage may be similar to the lower boundary voltage, and
the first reference voltage may be similar to the upper boundary voltage at the second level minus the second intermediate voltage, which refers to the lower boundary voltage, and
the input-output pad voltage may be similar to the upper boundary voltage at a first level.

17. The device of claim 12, wherein:
during a first mode of operation, the first supply voltage may be similar to the upper boundary voltage at a first level, the second reference voltage may be similar to the second intermediate voltage, and the second supply voltage may be similar to the lower boundary voltage, and
the first reference voltage may be similar to the upper boundary voltage at the first level minus the second intermediate voltage, which refers to the first intermediate voltage.

18. The device of claim 12, wherein:
during a second mode of operation, the first supply voltage may be similar to the upper boundary voltage at a second level that is less than the first level, the second reference voltage may be similar to the second intermediate voltage, and the second supply voltage may be similar to the lower boundary voltage, and
the first reference voltage may be similar to the upper boundary voltage at the second level minus the second intermediate voltage.

19. The device of claim 12, wherein:
during a third mode of operation, the first supply voltage may be similar to the upper boundary voltage at a third level that is less than the second level, the second reference voltage may be similar to the second intermediate voltage, and the second supply voltage may be similar to the lower boundary voltage, and
the first reference voltage may be similar to the upper boundary voltage at the third level minus the second intermediate voltage, which refers to the lower boundary voltage.

20. A device comprising:
an output stage having output transistors that receive tracking signals and provide an input-output pad voltage to an input-output pad based on the tracking signals;
a gate tracking stage that receives operational voltages, receives node voltages and provides the tracking signals to the output transistors based on the operational voltages and the node voltages;
a mode tracking stage that receives the operational voltages, receives the input-output pad voltage as a feedback voltage, and provides the node voltages to the gate tracking stage based on the operational voltages and the feedback voltage;
receiver input tracking circuitry that receives the node voltages, receives the feedback voltage and provides a receiver input signal; and
receiver circuitry that receives the receiver input signal and provides a receiver output signal based on the receiver input signal.

21. The device of claim 20, wherein:
the tracking signals include a first tracking signal, a first reference tracking signal, a second tracking signal, and a second reference tracking signal,
the operational voltages include a first voltage, a first reference voltage related to the first voltage, a second voltage different than the first voltage, and a second reference voltage related to the second voltage, and
the mode tracking stage receives the first reference voltage, receives the second reference voltage, receives the input-output pad voltage as the feedback voltage, and provides the node voltages to the gate tracking stage based on the first reference voltage, the second reference voltage and the feedback voltage.

22. The device of claim 20, further comprising:
an N-well tracking stage that receives one or more of the node voltages and provides a well control signal to base terminals of one or more of the output transistors of the output circuitry.

23. A method comprising:
fabricating an input-output pad that is configured to receive and supply an input-output pad voltage;
fabricating gate tracking circuitry that receives a first voltage, receives a second voltage different than the first voltage, receives node voltages and provides a first tracking voltage and a second tracking voltage based on the first voltage, the second voltage and the node voltages;
fabricating output circuitry that receives the first tracking voltage and the second tracking voltage from the gate tracking circuitry and provides the input-output pad voltage to the input-output pad based on the first tracking voltage and the second tracking voltage;
fabricating receiver input tracking circuitry that receives the node voltages, receives the input-output pad voltage and provides a receiver input signal; and
fabricating receiver circuitry that receives the receiver input signal and provides a receiver output signal based on the receiver input signal.

* * * * *